(12) United States Patent
Avci et al.

(10) Patent No.: US 11,863,227 B2
(45) Date of Patent: Jan. 2, 2024

(54) RADIO FREQUENCY SWITCHES WITH FAST SWITCHING SPEED

(71) Applicant: Analog Devices International Unlimited Company, Limerick (IE)

(72) Inventors: Celal Avci, Istanbul (TR); Ercan Kaymaksut, Istanbul (TR); Huseyin Kayahan, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/452,202

(22) Filed: Oct. 25, 2021

(65) Prior Publication Data

US 2023/0128170 A1   Apr. 27, 2023

(51) Int. Cl.
*H04B 1/44* (2006.01)
*H04B 1/00* (2006.01)
*H04B 1/16* (2006.01)

(52) U.S. Cl.
CPC ............. *H04B 1/44* (2013.01); *H04B 1/0078* (2013.01); *H04B 1/1615* (2013.01)

(58) Field of Classification Search
CPC . H04B 1/44; H04B 1/48; H04B 1/006; H04B 1/00; H04B 1/0064; H04B 1/38; H04B 7/0602; H04B 7/0837; H04B 1/0078; H04B 1/18; H04B 1/54; H04B 15/00; H04B 7/06; H04B 7/08; H04B 7/0831; H04B 1/005; H04B 1/0057; H04B 1/0458; H04B 1/405; H04B 1/406; H04B 1/525; H04B 7/212; H03K 17/693; H03K 17/063; H03K 17/102; H03K 2017/066; H03K 17/9537; H03K 2217/0054; H03K 17/16; H03K 17/161; H03K 17/687;
(Continued)

(56) References Cited

U.S. PATENT DOCUMENTS 5,355,036 A   10/1994  Gata
5,541,600 A    7/1996  Blumenkrantz et al.
(Continued)

FOREIGN PATENT DOCUMENTS

CN   103166625 A   6/2013
CN   103731119 A   4/2014
(Continued)

OTHER PUBLICATIONS

International Search Report and Written Opinion received in PCT/EP2022/079387 dated Feb. 7, 2023.

*Primary Examiner* — Golam Sorowar
(74) *Attorney, Agent, or Firm* — Knobbe, Martens, Olson & Bear, LLP

(57) ABSTRACT

Radio frequency switches with improved switching speed are provided. In certain embodiments, an RF switching circuit includes a FET switch including a gate, a digital buffer configured to provide a first output voltage to the gate of the FET during a steady-state, and a fast switching circuit in parallel with the digital buffer and configured to provide a second output voltage to the gate of the FET during a switching state. The fast switching circuit includes at least one charge pump configured to boost at least one supply voltage to a multiple of the at least one supply voltage. The fast switching circuit is configured to generate the second output voltage based on the boosted at least one supply voltage.

18 Claims, 15 Drawing Sheets

(58) Field of Classification Search
CPC ..... H03K 2217/0018; H03K 17/04123; H03K 17/04206; H03K 17/06; H03K 17/10; H03K 17/122; H03K 17/162; H03K 3/012; H03K 17/04106; H03K 17/6871; H03K 17/76

See application file for complete search history.

(56) References Cited

U.S. PATENT DOCUMENTS

| | | | |
|---|---|---|---|
| 5,798,959 A | 8/1998 | Onetti et al. | |
| 6,642,578 B1 | 11/2003 | Arnold et al. | |
| 7,123,884 B2 | 10/2006 | Nakakubo et al. | |
| 7,579,634 B2 | 8/2009 | Onodera et al. | |
| 7,613,442 B1 | 11/2009 | Kelly et al. | |
| 8,547,157 B1 | 10/2013 | Mangold et al. | |
| 8,649,741 B2 | 2/2014 | Lijima et al. | |
| 8,710,899 B2 | 4/2014 | George | |
| 8,963,618 B2 | 2/2015 | Keane et al. | |
| 9,048,739 B2 | 6/2015 | Shoji et al. | |
| 9,374,124 B2 | 6/2016 | Kolcuoglu et al. | |
| 9,379,698 B2 | 6/2016 | Nohra | |
| 9,413,362 B2 * | 8/2016 | Englekirk | H02M 3/073 |
| 9,525,415 B2 | 12/2016 | Seshita | |
| 9,548,722 B2 | 1/2017 | Atesal et al. | |
| 9,577,626 B2 | 2/2017 | Crandall et al. | |
| 9,628,075 B2 | 4/2017 | Cebi et al. | |
| 9,667,227 B2 | 5/2017 | Ranta | |
| 9,667,244 B1 | 5/2017 | Cavus et al. | |
| 9,667,255 B2 | 5/2017 | Englekirk | |
| 9,712,158 B1 | 7/2017 | Cavus et al. | |
| 9,742,400 B2 | 8/2017 | Bakalski et al. | |
| 10,044,349 B2 | 8/2018 | Scott et al. | |
| 10,090,339 B2 | 10/2018 | Leipold et al. | |
| 10,135,438 B2 | 11/2018 | Heaney et al. | |
| 10,148,298 B2 | 12/2018 | Jo et al. | |
| 10,153,767 B2 | 12/2018 | Burgener et al. | |
| 10,263,616 B1 | 4/2019 | Scott et al. | |
| 10,270,437 B2 | 4/2019 | Scott et al. | |
| 10,320,379 B2 | 6/2019 | Kerr et al. | |
| 10,659,031 B2 | 5/2020 | Franck et al. | |
| 10,778,206 B2 | 9/2020 | Kolcuoglu et al. | |
| 11,152,917 B1 * | 10/2021 | Akkaya | H03K 17/04206 |
| 11,405,034 B1 * | 8/2022 | Shapiro | H03K 17/693 |
| 2006/0128334 A1 | 6/2006 | Ikuta et al. | |
| 2007/0013432 A1 | 1/2007 | Miyazawa | |
| 2010/0066427 A1 | 3/2010 | George | |
| 2010/0117713 A1 | 5/2010 | Katoh et al. | |
| 2011/0260774 A1 | 10/2011 | Granger-Jones et al. | |
| 2014/0002214 A1 | 1/2014 | Bawell et al. | |
| 2015/0244051 A1 | 8/2015 | Domino | |
| 2015/0288359 A1 | 10/2015 | Bakalski et al. | |
| 2015/0349837 A1 | 12/2015 | Popplewell et al. | |
| 2016/0248400 A1 | 8/2016 | Walker | |
| 2017/0272066 A1 | 9/2017 | Scott et al. | |
| 2018/0091044 A1 * | 3/2018 | Salem | H02M 3/07 |
| 2019/0296726 A1 * | 9/2019 | Kolcuoglu | H03K 17/693 |
| 2020/0112300 A1 * | 4/2020 | Balteanu | H04B 1/44 |
| 2020/0350906 A1 | 11/2020 | Aubain et al. | |
| 2022/0094264 A1 * | 3/2022 | Kurachi | H02M 3/07 |

FOREIGN PATENT DOCUMENTS

| | | |
|---|---|---|
| CN | 105487086 A | 4/2016 |
| CN | 105490670 A | 4/2016 |
| CN | 106603053 A | 4/2017 |
| EP | 0 753 940 A1 | 1/1997 |
| GB | 2 415 844 A | 1/2006 |
| JP | H05 95239 A | 4/1993 |
| JP | 2002/064974 A | 2/2002 |
| JP | 2002/064975 A | 2/2002 |
| JP | 2013-48390 | 3/2013 |
| WO | WO 2012/015849 A1 | 2/2012 |

\* cited by examiner

RADIO FREQUENCY SWITCHES WITH FAST SWITCHING SPEED

FIELD OF THE DISCLOSURE

Embodiments of the invention relate to electronic systems, and more particularly, to radio frequency switches.

BACKGROUND

A radio frequency (RF) communication system can include RF switches used for a variety of purposes.

In one example, an RF communication system can include an antenna switch module (ASM) implemented using RF switches. Additionally, the antenna switch module can be used to electrically connect an antenna to a particular transmit or receive path of the system, thereby allowing multiple components to access the antenna. In another example, an RF communication system can include a digital step attenuator (DSA), and the DSA can include RF switches that are turned on or off to control an amount of attenuation provided by the DSA.

SUMMARY OF THE DISCLOSURE

Radio frequency (RF) switches with improved switching speeds are provided. In certain embodiments, an RF switching circuit includes a field-effect transistor (FET) switch, a buffer that provides a switch control voltage to a gate of the FET, and a fast switching circuit that boosts the voltage provided to the gate of the FET to increase switching speed. The fast switching circuit can include one or more charge pumps configured to boost the power high and power low supply voltages which are also used by the buffer. The fast switching circuit may also include one or more self-opening transistor stacks configured to protect the other components of the fast switching circuit when the boosted supply voltages are applied to the FET switch.

In one aspect, a radio frequency (RF) switching circuit is provided. The RF switching circuit includes a field-effect transistor (FET) switch including a gate; a digital buffer configured to provide a first output voltage to the gate of the FET switch during a steady-state of the FET switch; and a fast switching circuit configured to provide a second output voltage to the gate of the FET switch during a switching state of the FET switch, the fast switching circuit comprising at least one charge pump configured to generate at least one boosted supply voltage by boosting at least one supply voltage, the fast switching circuit configured to generate the second output voltage based on the at least one boosted supply voltage.

The at least one supply voltage can comprise a power high supply voltage and a power low supply voltage, the at least one charge pump comprises a first charge pump and a second charge pump, and the fast switching circuit comprises: a positive side including the first charge pump configured to receive the power high supply voltage and to boost the power high supply voltage to a voltage greater than 1.5 times the power high supply voltage, and a negative side including the second charge pump configured to receive the power low supply voltage and boost the power low supply voltage to a voltage greater than 1.5 times the power low supply voltage.

The positive side can further comprise a positive side switch stack coupling the first charge pump to an output node that provides the second output voltage, the positive side switch stack comprising a first plurality of transistor switches configured to self-open during a first switching state of the FET switch, and the negative side further comprises a negative side switch stack coupling the second charge pump to the output node, the negative side switch stack comprising a second plurality of transistor switches configured to self-open during a second switching state of the FET switch.

The negative side can further comprise a negative side switch stack coupling the second charge pump to an output node that provides the second output voltage, the negative side switch stack comprising a plurality of transistor switches in series and each having a gate coupled to a first gate resistor, a second gate resistor, and a third gate resistor arranged in series, wherein the first gate resistor is arranged parallel with a capacitor, and the third gate resistor is arranged in parallel with a diode.

The at least one charge pump can comprise a first charge pump including a first transistor coupled between a third supply voltage and a first node and configured to receive a precharge control signal, a second transistor coupled between the power high supply voltage and the first node and configured to receive a discharge control signal, and a capacitor coupled between the first node and a second node. The first charge pump can further comprise a third transistor coupled between the second node and the power high supply voltage, the first and second transistors configured to supply the third supply voltage to the first node prior to a first switching state of the FET switch and supply the power high supply voltage to the first node after the first switching state, and wherein changing the first node from the third supply voltage to the power high supply voltage boosts the second node to two times the power high supply voltage.

The at least one charge pump can comprise a first charge pump including a first switch coupled between a power low supply voltage and a first node and configured to receive a precharge control signal, a second switch coupled between a power high supply voltage and the first node and configured to receive a discharge control signal, and a capacitor coupled between the first node and a second node. The charge pump can further comprise a diode coupled between the second node and the power high supply voltage, the first and second switches configured to supply the power low supply voltage to the first node prior to a first switching state of the FET switch and supply the power high supply voltage to the first node after the first switching state, and wherein changing the first node from the power low supply voltage to the power high supply voltage boosts the second node to a voltage greater than 2.5 times the power high supply voltage.

Each of the first and second switches can comprise a pair of stacked transistors.

The at least one charge pump can comprise a first charge pump including a first switch coupled between a power high supply voltage and a first node, a second switch coupled between a power low supply voltage and the first node, and a capacitor directly coupled between the first node and an output node that provides the second output voltage. The first switch can be configured to receive a positive charge control signal and the second switch is configured to receive a negative charge control signal, the first and second switched configured to couple the first node to the power low supply voltage prior to a first switching state of the FET switch, couple the first node to the power high supply voltage after the first switching state, couple the first node to the power high supply voltage prior to a second switching state of the FET switch, and coupled the first node to the power low supply voltage after the second switching state.

The fast switching circuit can comprise a positive side including a first plurality of cascaded charge pumps and a negative side including a second plurality of cascaded charge pumps.

Another aspect is a fast switching circuit for driving a transistor gate of a transistor switch, the circuit comprising: a first charge pump configured to receive a power high supply voltage and to generate a boosted power high supply voltage greater than the power high supply voltage; a first switch stack coupled between the first charge pump and an output node that controls the transistor gate; a second charge pump configured to receive a power low supply voltage and to generate a boosted power low supply voltage less than the power low supply voltage; and a second switch stack coupled between the second charge pump and the output node, wherein the first charge pump and the second charge pump are configured to output one of the boosted power high supply voltage or the boosted power low supply voltage during a switching state of the transistor switch.

The first charge pump can comprise a first transistor coupled between a third supply voltage and a first node and configured to receive a positive precharge control signal, a second transistor coupled between the power high supply voltage and the first node and configured to receive a positive discharge control signal, and a first capacitor coupled between the first node and a second node.

The first charge pump can further comprise a third transistor coupled between the second node and the power high supply voltage, the first and second transistors configured to supply the third supply voltage to the first node prior to a first switching state of the transistor switch and supply the power high supply voltage to the first node after the first switching state, and wherein changing the first node from the third supply voltage to the power high supply voltage boosts the second node to two times the power high supply voltage.

The second charge pump can comprise a fourth transistor coupled between the third supply voltage and a third node and configured to receive a negative precharge control signal, a fifth transistor coupled between the power low supply voltage and the third node and configured to receive a negative discharge control signal, and a second capacitor coupled between the third node and a fourth node.

The second charge pump can further comprise a sixth transistor coupled between the fourth node and the power low supply voltage, the third and fourth transistors configured to supply the third supply voltage to the third node prior to a second switching state of the transistor switch from high to low and supply the power low supply voltage to the third node after the second switching state, and wherein changing the third node from the third supply voltage to the power low supply voltage boosts the fourth node to two times the power low supply voltage.

The first charge pump can comprise a first plurality of cascaded charge pumps and the second charge pump comprises a second plurality of cascaded charge pumps.

The first and second charge pumps can share a single capacitor directly coupled between the first and second charge pumps and the output node.

Yet another aspect is a method of radio frequency (RF) switching, the method comprising: generating a boosted power high supply voltage greater than a power high supply voltage using a first charge pump; providing the boosted power high supply voltage to an RF switch during a first switching state of the RF switch; generating a boosted power low supply voltage less than a power low supply voltage using a second charge pump; providing the boosted power low supply voltage to the RF switch during a second switching state of the RF switch; and providing one of the power high supply voltage or the power low supply voltage to the RF switch during a steady state of the RF switch.

DETAILED DESCRIPTION OF EMBODIMENTS

Figure 1:
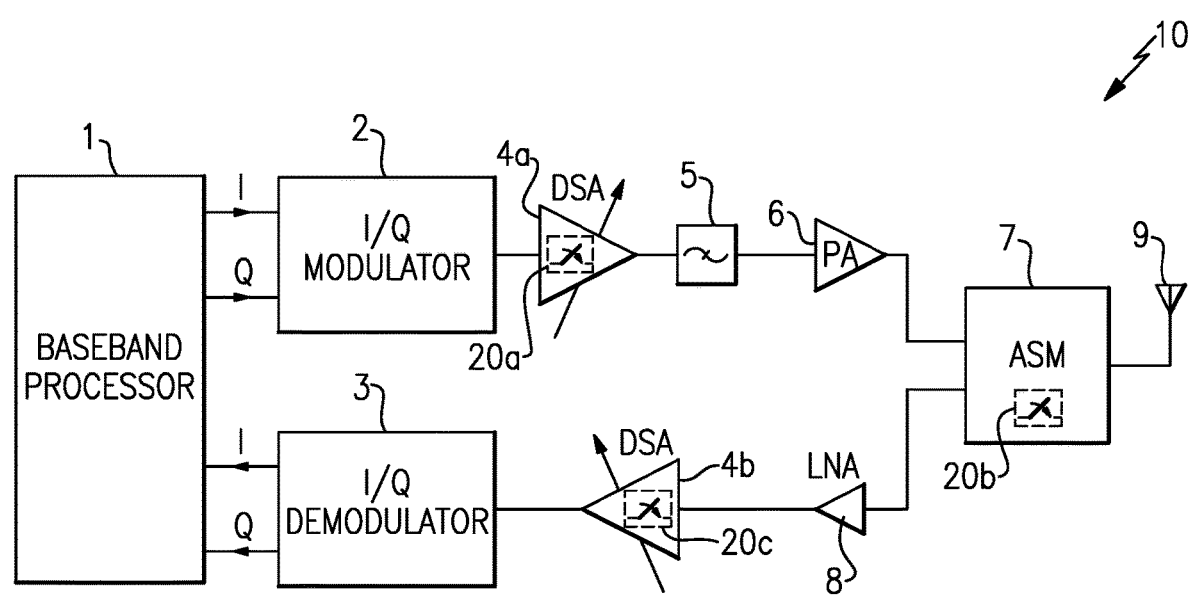
FIG. 1 is a schematic diagram of one example of a radio frequency (RF) system that can include one or more RF switching circuits in accordance with the teachings herein.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. Such RF communication systems can include one or more RF switches to provide control over routing of RF signals, connectivity between components or circuits, and/or to provide various other switching functions. Examples of RF communication systems with one or more RF switches include, but are not limited to, base stations, mobile devices (for instance, smartphones or handsets), laptop computers, tablets, Internet of Things (IoT) devices, and/or wearable electronics.

Certain RF switching circuits include a field-effect transistor (FET) switch and a switch bias circuit that controls a gate voltage of the switch to thereby change a channel impedance of the switch and modulate the switch's conductivity. For example, the switch bias circuit can control the gate voltage to a first level to turn off the FET switch such that the channel impedance is high and the RF signal does not pass through the FET switch. Additionally, the switch bias circuit can control the gate voltage to a second level to turn on the FET switch such that the channel impedance is low and the RF signal passes through the FET switch. Thus, the switch bias circuit is used to turn the FET switch on or off to control passage of the RF signal.

An RF signal can couple onto the gate of the FET switch via a parasitic gate-to-drain capacitance (Cgd) and/or a parasitic gate-to-source capacitance (Cgs) of the FET switch. To provide isolation, a gate resistor can be included between an output of the switch bias circuit and the gate of the FET switch.

Several benefits are provided by a large resistance value of the gate resistor, such as low loss and/or low cutoff frequency to provide wideband operation. However, making the resistance value of the gate resistor large also undesirably lengthens the turn-on time and turn-off time of the FET switch. For example, when the switch bias circuit changes the gate voltage of the FET switch, there is an undesirable switching delay based on a resistor-capacitor (RC) time constant arising from a resistance of the gate resistor and a gate capacitance of the FET switch. The delay in switching leads to an increase in turn-on time and turn-off time of the switch. As used herein, the speed of a RF switch may refer to the turn-on time and/or turn-off time of the switch.

Thus, although implementing the gate resistor with a high resistance provides a number of benefits, it also degrades the switching performance of the FET switch.

To achieve short switching time, an RF system can include an RF switch having a control input that controls an impedance of the RF switch, a multi-level buffer configured to receive a control signal for selectively activating the RF switch, and a resistor electrically connected between an output of the multi-level buffer and the control input to the RF switch. Additionally, the multi-level buffer generates a switch control voltage at the output, and pulses the switch control voltage in response to a transition of the control signal to thereby shorten a delay in switching the RF switch.

Thus, rather than directly transitioning the switch control voltage from an ON voltage to an OFF voltage, or vice versa, the switch control voltage is pulsed before being controlled to a steady-state voltage level. By pulsing the switch control voltage in this manner, charging or discharging at the control input of RF switch occurs faster, which shortens the switching delay of the RF switch. Embodiments of multi-level buffers for driving RF switches are provided herein. Further embodiments relate to at least temporarily boosting the voltage applied to the gate resistor, thereby increasing the speed at which the gate reaches the desired voltage level. The boosted voltage may only need to be applied at the transitions between on and off (and vice versa) and the typical ON voltage or OFF voltage can be applied to the gate during a steady-state.

In certain implementations, the multi-level buffer controls the RF switch not only with a steady-state switch ON voltage (for instance, a power high supply voltage) and a steady-state switch OFF voltage (for instance, a power low supply voltage or ground voltage), but also with a high voltage greater than the steady-state switch ON voltage and a low voltage lower than the steady-state switch OFF voltage. In certain embodiments, the high voltage and the low voltage may be produced using boost circuit(s), as described herein.

For example, when turning on an n-type field-effect transistor (NFET) switch, the multi-level buffer uses the high voltage to control the gate voltage of the NFET switch for a portion of time, and thereafter controls the gate voltage with the steady-state switch ON voltage. Additionally, when turning off the NFET switch, the multi-level buffer uses the low voltage to control the gate voltage of the NFET switch for a portion of time, and thereafter controls the gate voltage with the steady-state switch OFF voltage. The result is a speed-up of the turn-on and turn-off times of the NFET switch.

In certain implementations, the voltage level of the pulse is beyond a breakdown voltage at which the switch can reliably operate, for example, in excess of a maximum gate-to-source voltage for FET switches. Thus, the pulse voltage level would damage the switch due to reliability considerations if used to control the switch in the steady-state. However, by applying the pulse via the resistor or other impedance, the voltage directly at the control input of the switch remains within a voltage range for reliable operation. Thus, the benefits of fast switching time are achieved without damaging the switch.

In certain implementations, the multi-level buffer is also implemented using standard voltage FETs that cannot reliably handle the full voltage of the pulse.

Pulsing the switch control voltage provides an enhancement to switching speed with little to no impact on other performance characteristics of the RF switch, such as linearity, power handling capability, and/or insertion loss. For example, the switch control voltage can be pulsed without needing to include additional circuitry along the RF signal path through the switch or at the control input of the RF switch. Thus, the switching speed is improved without needing to add circuitry such as resistor bypass switches that could degrade performance by parasitically loading the RF switch.

FIG. 1 is a schematic diagram of one example of an RF communication system 10 that can include one or more RF switching circuits in accordance with the teachings herein.

Although, the RF communication system 10 illustrates one example of an electronic system that can include one or more RF switching circuits, the RF switching circuits described herein can be used in other configurations of electronic systems.

Furthermore, although a particular configuration of components is illustrated in FIG. 1, the RF communication system 10 can be adapted and modified in a wide variety of ways. For example, the RF communication system 10 can include more or fewer receive paths and/or transmit paths. Additionally, the RF communication system 10 can be modified to include more or fewer components and/or a different arrangement of components, including, for example, a different arrangement of RF switching circuits.

In the illustrated configuration, the RF communication system 10 includes a baseband processor 1, an I/Q modulator 2, an I/Q demodulator 3, a first digital step attenuator 4a, a second digital step attenuator 4b, a filter 5, a power amplifier 6, an antenna switch module 7, a low noise amplifier 8, and an antenna 9.

As shown in FIG. 1, baseband processor 1 generates an in-phase (I) transit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transit signals to radio frequency, and a signal combiner for combining the upconverted I and Q signals into the modulated RF signal.

The first digital step attenuator 4a receives the modulated RF signal, and attenuates the modulated RF signal to generate an attenuated RF signal. The first digital step attenuator 4a can aid in obtaining a desired gain and/or power level associated with transmission. In the illustrated configuration, the first digital step attenuator 4a includes a first RF switching circuit 20a. The first digital step attenuator 4a illustrates one example of a circuit that can include one or more RF switching circuits in accordance with the teachings herein. For example, the first digital step attenuator 4a can include a cascade of attenuator stages, each of which can be bypassed using an RF switching circuit to aid in providing a digitally adjustable amount of attenuation.

The filter 5 receives the attenuated RF signal from the first digital step attenuator 4a, and provides a filtered RF signal to an input of the power amplifier 6. In certain configurations, the filter 5 can be a band pass filter configured to provide band filtering. However, the filter 5 can be a low pass filter, a band pass filter, a notch filter, a high pass filter, or a combination thereof, depending on the application.

The power amplifier 6 can amplify the filtered RF signal to generate an amplified RF signal, which is provided to the antenna switch module 7. The antenna switch module 7 is further electrically connected to the antenna 9 and to an input of the low noise amplifier 8. The antenna switch module 7 can be used to selectively connect the antenna 9 to the output of the power amplifier 6 or to the input of the low noise amplifier 8. In certain implementations, the antenna switch module 7 can provide a number of other functionalities, including, but not limited to, band switching, switching between transmit and receive, and/or switching between different power modes.

In the illustrated configuration, the antenna switch module 7 includes a second RF switching circuit 20b. The antenna switch module 7 illustrates another example of a circuit that can include one or more RF switching circuits in accordance with the teachings here. For example, the antenna switch module 7 can include an RF switching circuit implemented as a single pole multi-throw switch. Although FIG. 1 illustrates a configuration in which the antenna switch module 7 operates as a single pole double throw switch, the antenna switch module 7 can be adapted to include additional poles and/or throws.

The LNA 8 receives an antenna receive signal from the antenna switch module 7, and generates an amplified antenna receive signal that is provided to the second digital step attenuator 4b. The second digital step attenuator 4b can attenuate the amplified antenna receive signal by a digitally-controllable amount of attenuation. As shown in FIG. 1, the second digital step attenuator 4b generates an attenuated receive signal, which is provided to the I/Q demodulator 3. Including the second digital step attenuator 4b can aid in providing the I/Q demodulator 3 with a signal that has a desired amplitude and/or power level. In the illustrated configuration, the second digital step attenuator 4b includes a third RF switching circuit 20c. The second digital step attenuator 4b illustrates another example of a circuit that can include one or more RF switching circuits in accordance with the teachings herein.

The I/Q demodulator 3 can be used to generate the I receive signal and the Q receive signal, as was descried earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF switching circuits 20a-20c can be used for handling RF signals using a variety of communication standards, including, for example, Global System for Mobile Communications (GSM), Code Division Multiple Access (CDMA), wideband CDMA (W-CDMA), Long Term Evolution (LTE), Enhanced Data Rates for GSM Evolution (EDGE), 3G, 4G, and/or 5G, as well as other proprietary and non-proprietary communications standards.

Moreover, the RF switching circuits 20a-20c can control switching of signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Providing an RF switch in a transmit or receive path of an RF communication system can impact the system's performance. For example, not only can the RF switch's linearity, power handling capability, and insertion loss impact operations of the system, but also transient performance characteristics such as turn-on time, turn-off time, and/or settling time can provide a performance impact. The teachings herein can be used improve transient performance characteristics of an RF switch, with little to no impact on other performance characteristics of the RF switch, such as linearity, power handling capability, and/or insertion loss.

Figure 2A:
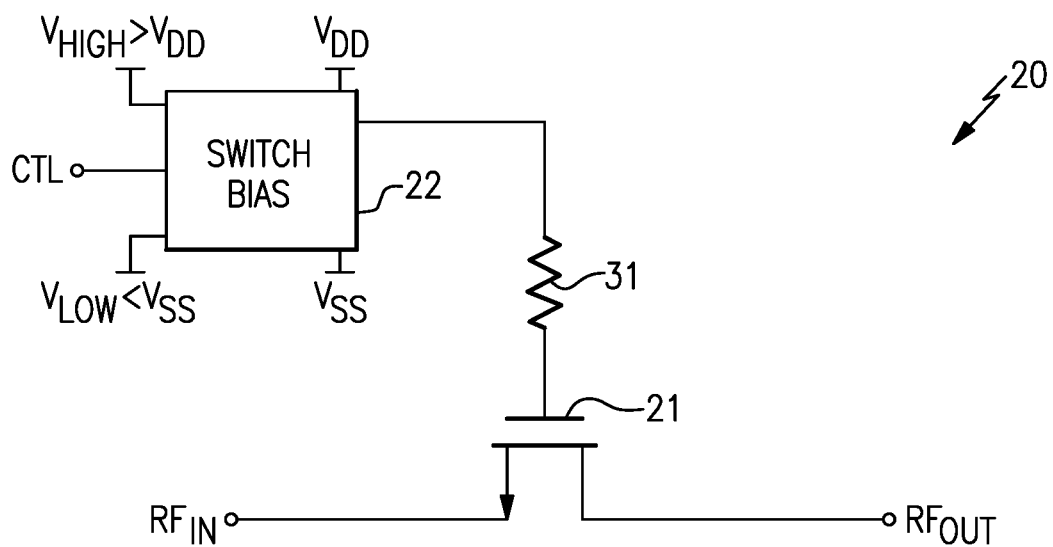
FIG. 2A is a circuit diagram of an RF switching circuit according to one embodiment.

FIG. 2A is a circuit diagram of an RF switching circuit 20 according to one embodiment. The RF switching circuit 20 includes an n-type field effect transistor (NFET) switch 21, a multi-level buffer 22 (also referred to herein as a switch bias circuit), and a gate bias resistor 31.

As shown in FIG. 2A, the multi-level buffer 22 receives a control signal CTL for indicating whether the NFET switch 21 should be turned on or turned off by the multi-level buffer 22. Thus, the control signal CTL is used to selectively activate the NFET switch 21. The multi-level buffer 22 also receives a power high supply voltage $V_{DD}$, a ground or power low supply voltage $V_{SS}$, a high voltage $V_{HIGH}$ greater than the power high supply voltage $V_{DD}$, and a low voltage $V_{LOW}$ lower than the power low supply voltage $V_{SS}$. The power high supply voltage $V_{DD}$ is also referred to herein as $+V_{DD}$, and the power low supply voltage $V_{SS}$ is also referred to herein as $-V_{SS}$.

Although FIG. 2A illustrates a configuration in which the multi-level buffer 22 is used to control one FET switch, the multi-level buffer 22 can be configured to bias one or more additional FET switches. In such configurations, the multi-level buffer 22 can include additional switch control inputs, such as a control signal associated with each FET switch. However, other configurations are possible, such as implementations in which a control signal is used to control multiple FET switches. For example, in certain implementations, a multi-level buffer is used to control a series FET switch as well as a shunt FET switch. Additionally, the series FET switch and the shunt FET switch can controlled by a common control signal such that when the series FET switch is turned on the shunt FET switch is turned off, and vice versa.

In the illustrated configuration, a source of the NFET switch 21 is electrically connected to the RF input $RF_{IN}$, and a drain of the NFET switch 21 is electrically connected to the RF output $RF_{OUT}$. Although an example in which an RF switch is connected between an RF input terminal and an RF output terminal, other configurations are possible, such as implementations in which the RF switch is connected between a first RF terminal and a second RF terminal that are bidirectional.

As shown in FIG. 2A, the gate bias resistor 31 is electrically connected between a gate bias output of the multi-level buffer 22 and a gate of the NFET switch 21. The gate bias resistor 31 can enhance isolation between the gate bias output of the multi-level buffer 22 and the gate of the NFET switch 21. For example, high frequency signal components can be coupled onto the gate of the NFET switch 21 via parasitic gain-to-drain and/or gate-to-source capacitances, and the gate bias resistor 31 can provide resistance that impedes the high frequency signal components from reaching the gate bias output of the multi-level buffer 22.

Although FIG. 2A illustrates the output of the multi-level buffer 22 being connected to the gate of the NFET switch 21 via the resistor 31, any suitable impedance can be connected between the output of the multi-level buffer 22 and the gate of the NFET switch 21. For example, in another embodiment, an inductor or a combination of an inductor and a resistor are connected between the output of a multi-level buffer and a control input to an RF switch.

The NFET switch 21 can be implemented in a variety of ways. In one embodiment, the NFET switch 21 is implemented as a silicon-on-insulator (SOI) metal oxide semiconductor (MOS) transistor including a body that is electrically floating. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

Although FIG. 2A illustrates a configuration using n-type transistors, the teachings herein are applicable to configurations using p-type transistors or a combination of n-type and p-type transistors. Furthermore, the teachings herein are applicable to other types of RF switches that include a control input for controlling the RF switch's impedance.

The RF switching circuit 20 can be used in a wide variety of configurations within an electronic system. For example, the NFET switch 21 can operate in a transmit signal path or a receive signal path of an RF communication system, such as the RF communication system 10 of FIG. 1.

With continuing reference to FIG. 2A, the multi-level buffer 22 receives the control signal CTL for selectively activating the NFET switch 21. In particular, the control signal CTL indicates whether the multi-level buffer 22 should turn on the NFET switch 21 or turn off the NFET switch 21.

The multi-level buffer 22 generates a switch control voltage at the gate bias output, and pulses the switch control voltage in response to a transition of the control signal CTL to thereby shorten a delay in switching the NFET switch 21.

Thus, rather than directly transitioning the switch control voltage from an ON voltage to an OFF voltage, or vice versa, the switch control voltage is temporarily pulsed before being controlled to a steady-state voltage level. By pulsing the switch control voltage in this manner, the switching delay of the NFET switch 21 is shortened.

The pulsing can be applied when turning on the NFET switch 21 to improve turn-on speed and/or when turning off the NFET switch 21 to improve turn-off speed. Although various embodiments herein provide a pulse for both an ON to OFF transition and for an OFF to ON transition, the teachings herein are also applicable to implementations in which a pulse is only provided for an ON to OFF transition or only provided for an OFF to ON transition. In such implementations, a multi-level buffer can include corresponding circuitry for providing the desired pulse, while omitting other circuitry not needed for providing the desired pulse.

In certain implementations, when switching the NFET switch 21 from an OFF state to an ON state, the multi-level buffer 22 first changes the switch control voltage from a steady-state switch OFF voltage (for instance, $V_{SS}$) to the high voltage $V_{HIGH}$, and then from the high voltage $V_{HIGH}$ to a steady-state switch ON voltage (for instance, $V_{DD}$). Thus, the multi-level buffer 22 pulses the switch control voltage when turning on the NFET switch 21.

By pulsing the switch control voltage in this manner, the turn-on time of the NFET switch 21 is shortened.

In certain implementations, when switching the NFET switch 21 from an ON state to an OFF state, the multi-level buffer 22 first changes the switch control voltage from a steady-state switch ON voltage (for instance, $V_{DD}$) to the low voltage $V_{LOW}$, and then from the low voltage $V_{LOW}$ to a steady-state switch OFF voltage (for instance, $V_{SS}$). Thus, the multi-level buffer 22 pulses the switch control voltage when turning off the NFET switch 21 to thereby shorten turn-off time. The duration of the pulse can be controlled in a wide variety of ways, including by logic circuitry configured to generate clock signal phases for timing the multi-level buffer 22 based on delaying an edge of the control single CTL.

The high voltage $V_{HIGH}$ and/or the low voltage $V_{LOW}$ can be provided in a wide variety of ways, including, but not limited to, receiving the voltage on a pin or generated using charge pumps or other voltage regulators. Likewise, $V_{DD}$ and/or $V_{SS}$ can be provided in a wide variety of ways, including, but not limited to, receiving the voltage on the pin or generated from other voltages (for instance, from $V_{HIGH}$ and/or $V_{LOW}$).

In certain implementations, at least one of the high voltage $V_{HIGH}$ or the low voltage $V_{LOW}$ is beyond a breakdown voltage for transistor reliability considerations, for example, beyond a maximum or below a minimum gate-to-source voltage permitted by the processing technology used to fabricate the NFET switch 21. Thus, controlling the gate of the NFET switch 21 with the high voltage $V_{HIGH}$ and/or the low voltage $V_{LOW}$ in the steady-state would potentially damage the RF switch 21 due to transistor reliability limitations.

However, by applying the pulsed switch control voltage to an opposite end of the gate resistor 31 as the end connected to the gate of the NFET switch 21, the voltage directly at the gate remains within a range of voltages acceptable for reliable operation of the NFET switch 21. Thus, the benefits of fast switching time are achieved while operating within voltage constraints or limitations of the NFET switch 21.

Figure 2B:
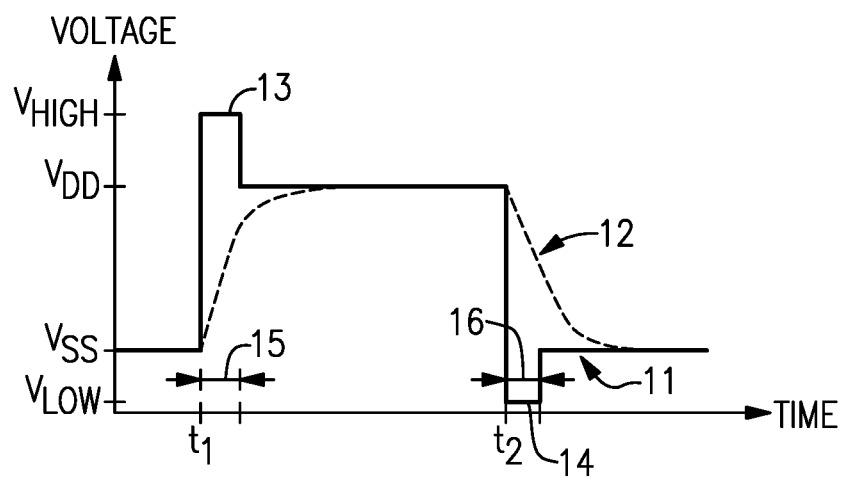
FIG. 2B is one example of a timing diagram for the RF switching circuit of FIG. 2A.

FIG. 2B is one example of a timing diagram for the RF switching circuit 20 of FIG. 2A. The timing diagram includes a first plot 11 of switch control voltage outputted by the multi-level buffer 22 versus time, and a second plot 12 of gate voltage of the NFET switch 21 versus time. The timing diagram includes a first time $t_1$ at which the control signal CTL transitions to turn the NFET switch 21 from an OFF state to an ON state, and a second time $t_2$ at which the control signal CTL transitions to turn the NFET switch 21 from the ON state to the OFF state.

As shown in FIG. 2B, the multi-level buffer 22 pulses the switch control voltage when turning on the switch as well as when turning off the switch, in this embodiment. For example, when the NFET switch 21 is turned on at time $t_1$, the multi-level buffer 22 generates a turn-on pulse 13 associated with first transitioning the switch control voltage from $V_{SS}$ to $V_{HIGH}$, and thereafter from $V_{HIGH}$ to $V_{DD}$. Additionally, when the NFET switch 21 is turned off at time $t_2$, the multi-level buffer 22 generates a turn-off pulse 14 associated with first transitioning the switch control voltage from $V_{DD}$ to $V_{LOW}$, and thereafter from $V_{LOW}$ to $V_{SS}$.

The duration 15 of the turn-on pulse 13 and the duration 16 of the turn-off pulse 14 can be controlled in a wide variety of ways. In a first example, the multi-level buffer 22 includes logic circuitry that performs logical operations on an input control signal and delayed versions thereof to generate clock signal phases that set the duration 15 and the duration 16.

As shown in FIG. 2B, the turn-on pulse 13 and the turn-off pulse 14 have opposite polarity. For example, the turn-on pulse 13 has increased voltage level before settling to a lower voltage level, while the turn-off pulse 14 has decreased voltage level before settling to a higher voltage level. In certain implementations, a multi-level buffer generates a first pulse in response to an ON to OFF transition of an RF switch, and generates a second pulse in response to an OFF to ON transition of the RF switch, and the first and second pulse have opposite polarity.

Figure 2C:
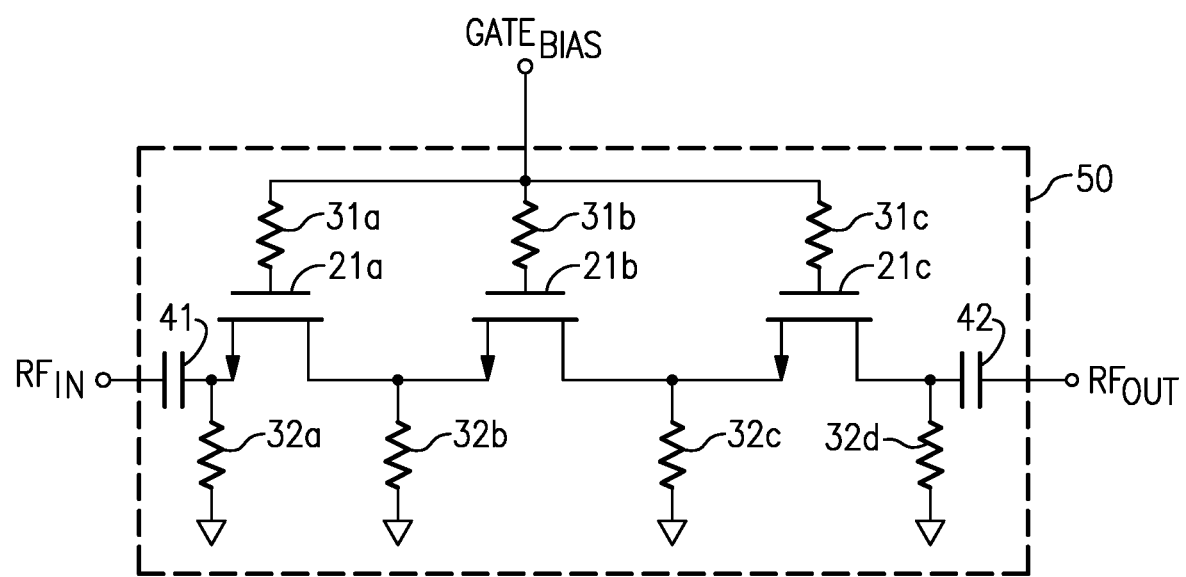
FIG. 2C is another example of an RF switch for use in an RF switching circuit.

FIG. 2C is another example of an RF switch 50 for use in an RF switching circuit.

The RF switch 50 includes a first NFET switch 21*a*, a second NFET switch 21*b*, a third NFET switch 21*c*, a first gate bias resistor 31*a*, a second gate bias resistor 31*b*, a third gate bias resistor 31*c*, a first channel biasing resistor 32*a*, a second channel biasing resistor 32*b*, a third channel biasing resistor 32*c*, a fourth channel biasing resistor 32*d*, a first DC blocking capacitor 41, and a second DC blocking capacitor 42. Although one embodiment of an RF switch is shown in FIG. 2C, the teachings herein are applicable to RF switches implemented in a wide variety of ways.

In the illustrated embodiment, the first NFET switch 21*a*, the second NFET switch 21*b*, and the third NFET switch 21*c* are in series with one another. Including multiple FET switch components in series can increase a power handling capability of an RF switch. Although an example with three FET switches in series is shown, more or fewer FET switches can be included to achieve desired performance characteristics. As shown in FIG. 2C, the gate bias resistors 31*a*-31*c* are electrically connected between a gate bias terminal $GATE_{BIAS}$ (which is driven by a multi-level buffer) and the gates of the NFET switches 21*a*-21*c*, respectively.

The channel biasing resistors 32*a*-32*d* collectively operate to control a bias voltage of the sources and drains of the NFET switches 21*a*-21*c*, thereby helping to control gate-to-source and gate-to-drain biasing characteristics of the transistors. Although one example of channel biasing is shown, other implementations of channel biasing are possible, including, but not limited to, implementations using resistors in parallel with the channels of one or more NFET switches.

The first DC blocking capacitor 41 and second DC blocking capacitor 42 provide DC blocking to allow the sources and drains of the NFET switches 21*a*-21*c* to operate at a different DC voltage levels than the RF input $RF_{IN}$ and the RF output $RF_{OUT}$. However, the teachings herein are also applicable to RF switches that operate without DC blocking capacitors.

Although one example of an RF switch with NFETs switches is shown, RF switches can also be implemented using p-type FET (PFET) switches or a combination of NFET switches and PFET switches.

Fast Switching Circuits for Improved RF Switching Speeds

Figure 3:
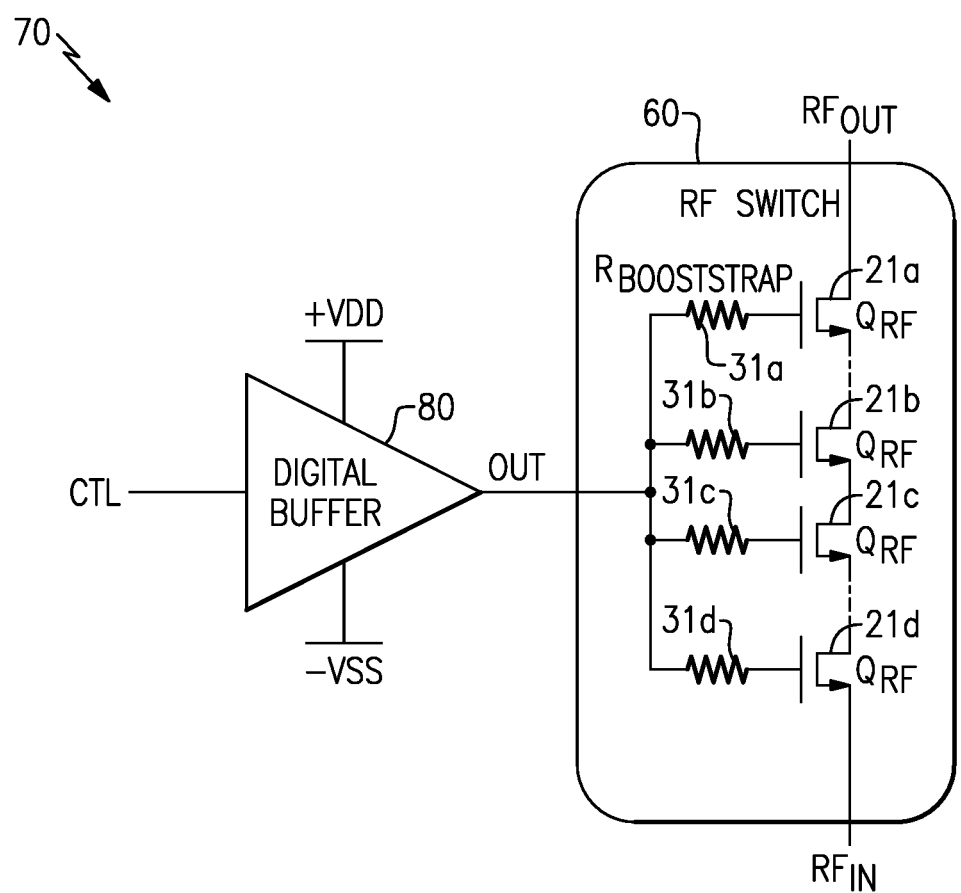
FIG. 3 is a circuit diagram of an RF switching circuit according to one embodiment.

FIG. 3 is a circuit diagram of one example of an RF switching circuit 70 according to one embodiment. The RF switching circuit 70 includes an RF switch 60, and a digital buffer 80. The digital buffer 80 is configured to receive a control signal CTL for indicating whether the RF switch 60 should be turned on or turned off by the digital buffer 80. Thus, the control signal CTL is used to selectively activate the RF switch 60. The digital buffer 80 also receives a power high supply voltage $V_{DD}$ and a ground or power low supply voltage $V_{SS}$.

As shown in FIG. 3, the RF switch 60 includes a first NFET switch 21*a*, a second NFET switch 21*b*, a third NFET switch 21*c*, . . . , and an n-th NFET switch 21*d*; a first gate bias resistor 31*a*, a second gate bias resistor 31*b*, a third gate bias resistor 31*c* . . . , and an n-th gate bias resistor 31*d*. The gate resistors 31*a*-31*d* are also be referred to as bootstrapping gate resistors herein. Although one embodiment of an RF switch 60 is shown in FIG. 3, the teachings herein are applicable to RF switches 60 implemented and/or biased in a wide variety of ways, such as the RF switch 50 of FIG. 2C.

In the illustrated embodiment, the first NFET switch 21*a*, the second NFET switch 21*b*, the third NFET switch 21*c*, and the n-th NFET switch 21*d* are in series with one another. Including multiple FET switch components in series can increase a power handling capability of an RF switch 60. Although an example with four FET switches in series is shown, more or fewer FET switches can be included to achieve desired performance characteristics. As shown in FIG. 3, the gate bias resistors 31*a*-31*d* are electrically connected between the output node OUT of the digital buffer 80 and the gates of the NFET switches 21*a*-21*d*, respectively.

Although one example of an RF switch with NFETs switches is shown, RF switches can also be implemented using p-type FET (PFET) switches or a combination of NFET switches and PFET switches.

Aspects of this disclosure relate to architectures and techniques for improving the switching speed of RF switches without affecting the insertion loss of the RF switch. In various embodiments, this can be accomplished without decreasing the resistance of the gate resistors (for example, resistors 31a-31d) or decreasing the size of the RF switch (for example, small transistor widths for transistors 21a-21d), but rather by increasing the gate voltage bias at a predetermined time so that the gate(s) of the RF switch are driven faster.

One important design specification for an RF switch is the insertion loss specification of the switch. The insertion loss of an RF switch is related to the size of the RF switch. For example, a smaller sized RF switch will have a larger $R_{ON}$ resistance compared to a larger sized RF switch. The increased $R_{ON}$ resistance which in turn increases the insertion loss of the RF switch. By increasing the size of the RF switch to improve insertion loss, the size of the transistor(s) are increased, which results in a higher capacitance for the transistor(s) (e.g., the gate-source capacitance $C_{GS}$ of the transistor(s)). This type of larger RF switch also typically includes bootstrapping gate resistors, which can also negatively affect the insertion loss of the RF switch. The contribution of the resistances of the bootstrapping gate resistors to the insertion loss can be reduced by increasing the bootstrapping gate resistances.

While the combination of a comparatively large bootstrapping gate resistance and a larger sized RF switch can reduce the insertion loss of the RF switch, this combination limits the RF switching speed due to the resistor-capacitor (RxC or RC) time constant introduced by these elements. While the RF switching speed of the RF switch can be increased by reducing the bootstrapping gate resistance, this results in an increase in the insertion loss of the RF switch. Alternatively, the RF switching speed of the RF switch can be increased by reducing the gate-source capacitance $C_{GS}$ of the transistor(s), however, this increases the ON Resistance of the RF switch, thus also leads to an increase in the insertion loss.

In view of the above, aspects of this disclosure relate to architectures and techniques for increasing the switching speed of an RF switch without introducing additional insertion loss.

Aspects of this disclosure also relate to the use of one or more series switch blocks (e.g., positive and negative side switch stacks) between a multiplied voltage (for example, a high voltage above $V_{DD}$ or a low voltage below $V_{SS}$) and the RF switch gate. These series switch blocks can be high voltage capable and have self-opening characteristics during high voltage switching events without any control voltage. With this high voltage capability, aspects of this disclosure achieve much faster switching than the traditional approaches.

Figure 4:
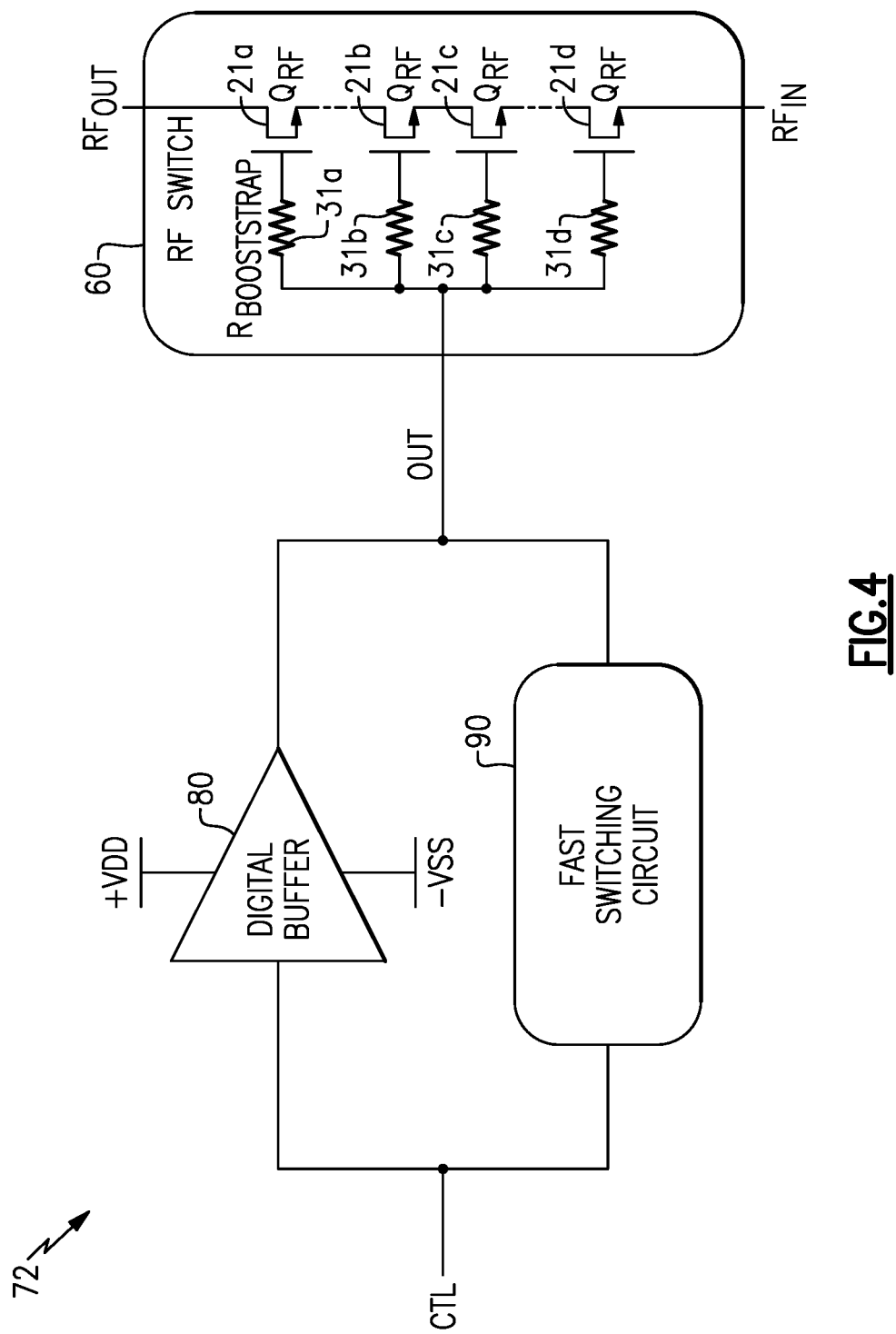
FIG. 4 is a circuit diagram of an RF switching circuit including a fast switching circuit according to one embodiment.

FIG. 4 is a circuit diagram of an RF switching circuit 72 including a fast switching circuit 90 according to one embodiment. In particular, the RF switching circuit 72 includes a digital buffer 80, a fast switching circuit 90, and an RF switch 60. The digital buffer and the RF switch 60 may be implemented similarly to the embodiment of FIG. 3.

The fast switching circuit 90 is configured to increase the gate voltages of the FET switches 21a-21d within the RF switch 60 to increase the switching speed of the RF switch 60. The fast switching circuit 90 can be configured to boost the voltage internally (for example, generate a high voltage greater than $V_{DD}$ and a low voltage less than $V_{SS}$) and does not require any external additional supply. For example, the fast switching circuit 90 can be configured to boost the voltage using the same power high supply voltage $V_{DD}$ and power low supply voltage $V_{SS}$ provided to the digital buffer 80. Advantageously, the fast switching circuit can boost the voltage without using any clock or clock signal generator, thereby preventing spurs from being introduced due to clock periodicity.

The fast switching circuit 90 can include one or more charge pumps (also referred to as a voltage multiplier or boost circuit) configured to boost the supply voltages $V_{DD}$ and $V_{SS}$ of the digital buffer, thereby boosting the node OUT voltage during the switching state. With respect to $V_{DD}$ such charge pumps are positive charge pumps that generate a high voltage greater than $V_{DD}$, while with respect to $V_{SS}$ such charge pumps are negative charge pumps that generate a low voltage less than $V_{SS}$.

In some implementations, the fast switching circuit 90 may not have an error free steady-state and/or lack sufficient drive strength for steady-state operation, and thus, the digital buffer 80 can be used to provide the steady-state (e.g., states other than the switching state) voltage to the output node OUT. Thus, the digital buffer 80 can fix the output node OUT voltage to the supply voltage $V_{DD}$ and $V_{SS}$ values, adding stability to the RF switching circuit 72.

Using a clock within the RF switching circuit 72 may generate spurs, which is not desirable for many applications. For example, a free-running oscillator can generate spurious frequency tones that can couple into RF signal paths and degrade RF signal purity. Providing a spur-free design is an advantage for these applications. Thus, certain embodiments of this disclosure provide charge pumps configured to boost the output node OUT voltage during transitions without using any oscillators or clock signals, thereby increasing switching speed without introducing spurs.

The fast switching circuit 90 can be configured to operate only during or in response to switching events (e.g., low to high transitions and high to low transitions) and does not significantly affect the system during steady-state (e.g., between transitions). In some implementations, the fast switching circuit 90 may include a relatively small loading capacitor at the output node OUT. As is described herein, implementations of the fast switching circuit 90 may have a charge pump structure without a clock, and thus, the fast switching circuit 90 does not generate spurs.

Depending on the implementation, the fast switching circuit 90 can be configured to boost the output voltage at the node OUT by multiplying the voltage to 2×, 3×, or any other integer multiplication of the output voltage at the node OUT during transitions. However, this disclosure is not limited thereto and in some implementations, the fast switching circuit 90 can be configured to boost the output voltage at the node OUT by fractional multiples of the output voltage (e.g., 1.5×, 2.5×, etc.). In certain implementations, the duration for which the boosted output voltage is applied can be set by a user of the fast switching circuit 90 using an interface and/or any other suitable mechanism for user programmability.

Figure 5:
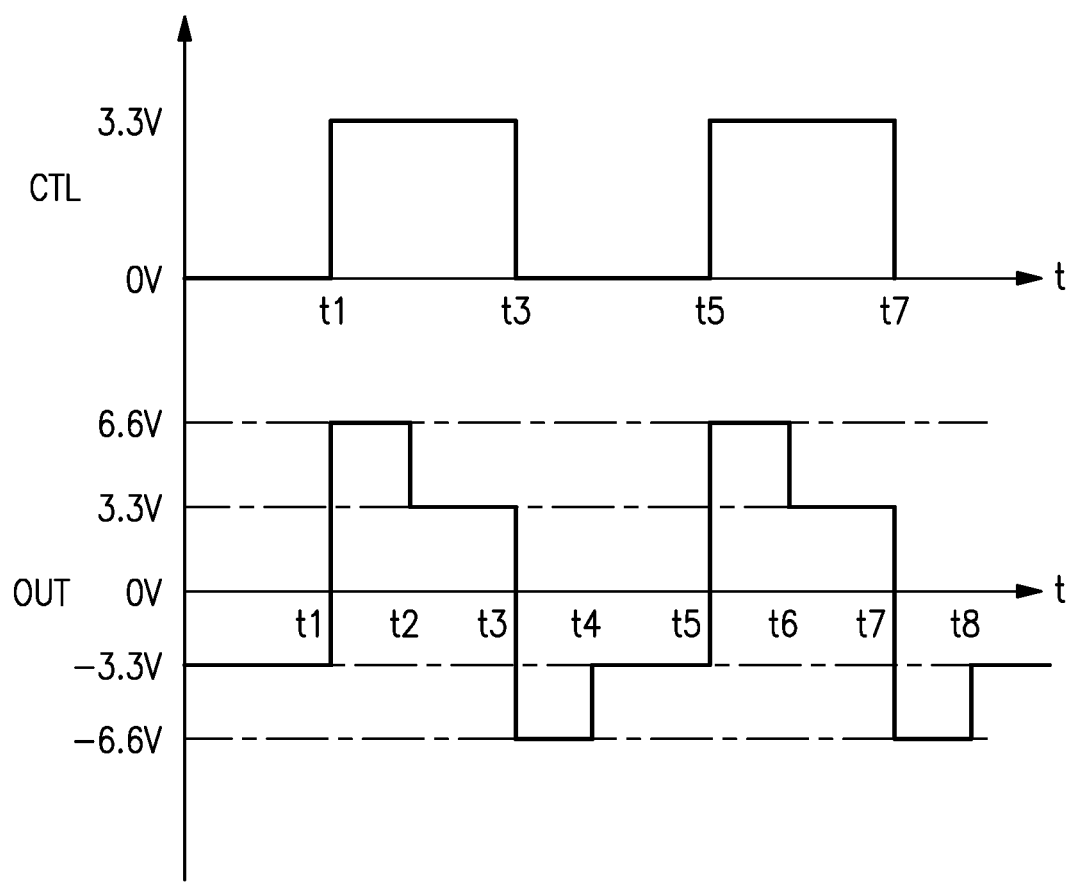
FIG. 5 illustrates the timing of the control signal CTL and the combined output node OUT voltage of the fast switching circuit and digital buffer in accordance with aspects of this disclosure.

FIG. 5 illustrates the timing of the control signal CTL and the combined output node OUT voltage of the fast switching circuit 90 and digital buffer 80 in accordance with aspects of this disclosure. As is illustrated in FIG. 5, the output node OUT voltage is boosted to a higher voltage during the transition from low to high and boosted to a lower voltage during the transition from high to low.

With reference to FIG. 5, the control signal CTL may alternate between a first, low level (e.g., 0V) and a second, high level (e.g., 3.3V). The particular voltage illustrated in FIG. 5 are merely example and other values may be used without departing from aspects of this disclosure. The control signal CTL transitions between the low level and the high level or vice versa at times t1, t3, t5, and t7.

The fast switching circuit 90 is configured to boost the output node OUT voltage for a defined length of time after each switching event (e.g., transition from low to high or from high to low). For example, the fast switching circuit 90 is configured to boost the output node OUT voltage to 6.6V between times t1 and t2, and then return to a voltage of 3.3V from time t2 to t3. Similarly, the fast switching circuit 90 is configured to boost the output node OUT voltage to -6.6V between times t3 and t4, and then return to a voltage of −3.3V from time t4 to t5. Thus, between times t1-t2, t3-t4, t5-t6, and t7-t8, the fast switching circuit 90 is configured to boost the output node OUT voltage in order to drive the transistor gates of the RF switch 60 with a larger voltage. In some embodiments, the timing of the above-indicated intervals can be set by the user of the fast switching circuit 90 in any suitable manner.

With continued reference to FIG. 5, the fast switching circuit 90 is configured to drive the output node OUT voltage to two times $V_{DD}$ during low to high transition (e.g., in the t1-t2 and t5-t6 intervals) and two times $V_{SS}$ during the high to low transition (e.g., in the t3-t4 and t7-t8 intervals). In the intervals defined between t2-t3, t4-t5, t6-t7 and after t8, the digital buffer circuit 80 is configured to drive the output node OUT voltage in order to provide the 3.3V and −3.3V voltages accurately. The fast switching circuit 90 can be configured to operate only during the above-identified switching intervals, and thus the fast switching circuit 90 has little to no impact on the performance during steady-state.

Figure 6A:
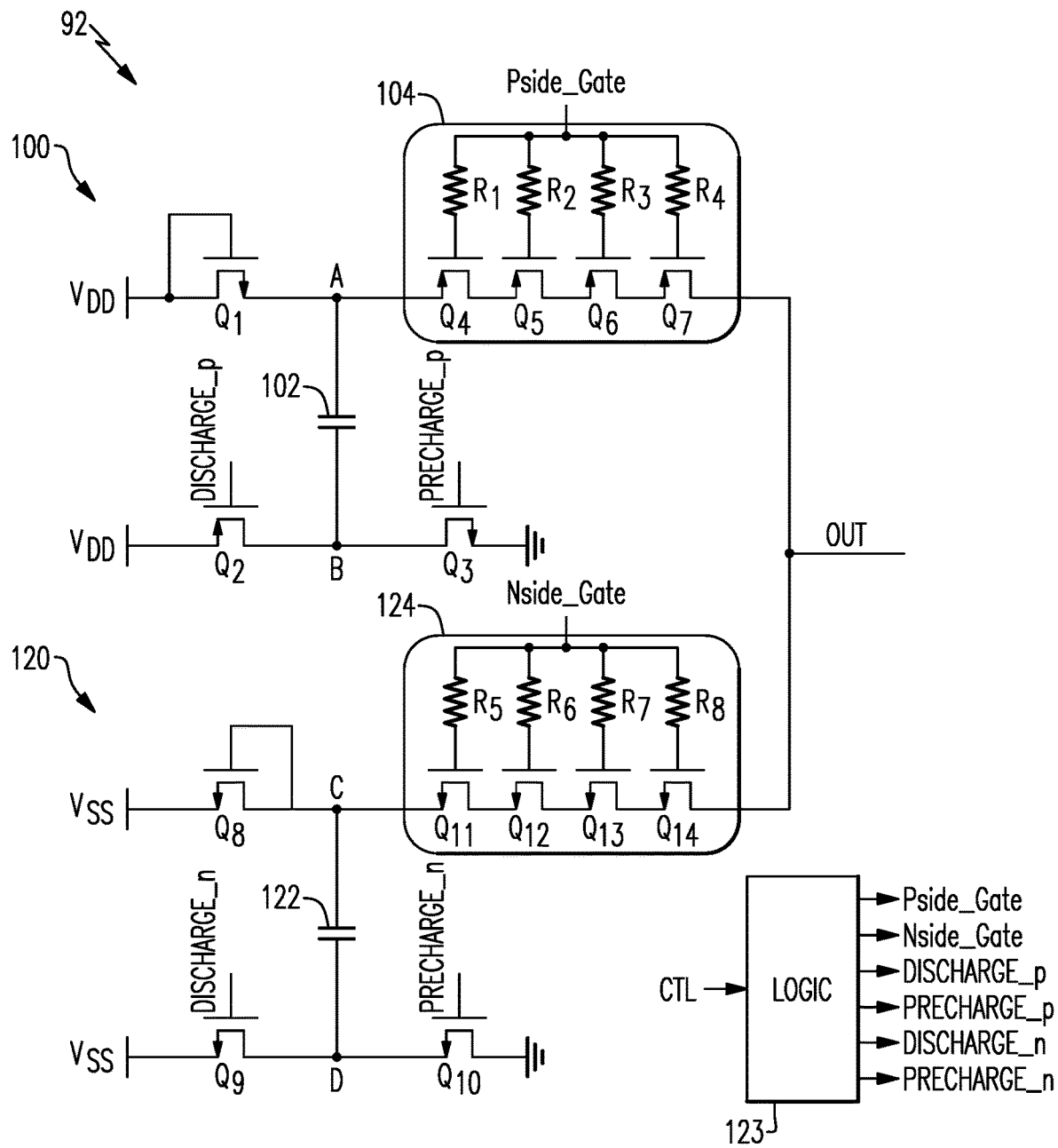
FIG. 6A is a circuit diagram of a fast switching circuit according to one embodiment.

FIG. 6A is a circuit diagram of a fast switching circuit 92 according to one embodiment. The fast switching circuit 92 includes a positive side 100 configured to boost the output node OUT voltage when the output node OUT voltage is positive and a negative side 120 configured to boost the output node OUT voltage when the output node OUT voltage is negative. The positive side 100 includes a first set of three transistors $Q_1$, $Q_2$, and $Q_3$ ($Q_1$-$Q_3$), a first capacitor 102, and a positive side switch stack 104. Similarly, the negative side 120 includes a second set of three transistors $Q_8$, $Q_9$, and $Q_{10}$ ($Q_8$-$Q_{10}$), a second capacitor 122, and a negative side switch stack 124.

The first set of transistors $Q_1$-$Q_3$ together with the first capacitor 102 form a first clockless charge pump circuit configured to boost the power high supply voltage $V_{DD}$ to a voltage higher than the power high supply voltage $V_{DD}$ based on a first precharge signal Precharge_p and a first discharge signal Discharge_p, which can be generated in any suitable way, such as digital logic processing of the control signal CTL using a logic circuit 123. The boosted voltage is then provided to the positive side switch stack 104. On the negative side 120, the second set of transistors $Q_8$-$Q_{10}$ together with the second capacitor 122 form a second clockless charge pump circuit configured to boost the power low supply voltage $V_{SS}$ based on a second precharge signal Precharge_n and a second discharge signal Discharge_n, which can be generated in any suitable way, such as digital logic processing of the control signal CTL using the logic circuit 123. The boosted voltage is then provided to the negative side switch stack 124. In some embodiments, the power high supply voltage $V_{DD}$ may be about +3.3V, and the first clockless charge pump doubles the voltage to about +6.6V and the power low supply voltage $V_{SS}$ may be about −3.3V, and the second clockless charge pump doubles the voltage to about −6.6V.

In some implementations, there may be some inefficiencies in the charge pump circuits such that the boosted signals are not fully double the power high/low supply voltages $V_{DD}$ and $V_{SS}$. Depending on the implementation the first and second charge pump circuits may be configured to boost the respective power high/low supply voltages $V_{DD}$ and $V_{SS}$ to greater than 1.5 times, greater than 1.8 times, and/or greater than 1.9 times the power high/low supply voltages $V_{DD}$ and $V_{SS}$. As described in connection with FIG. 7 below, the first and second charge pump circuits may be configured to boost the respective power high/low supply voltages $V_{DD}$ and $V_{SS}$ to double the respective power high/low supply voltages $V_{DD}$ and $V_{SS}$ minus the gate-source voltage of one of the NFETs (e.g., $V_{gs}Q_1$ or $V_{gs}Q_8$) in the respective charge pump circuits.

As shown in FIG. 6A the positive side switch stack 104 is controlled by a first control signal Pside_Gate and the negative side switch stack 124 is controlled by a second control signal Nside_gate. In certain implementations, the first control signal Pside_Gate and the second control signal Nside_gate (as well as other depicted control signals) are generated by the logic circuit 123, which can be implemented without any clock signals or oscillators. Rather, the logic circuit 123 can generate the depicted control signals by delaying the control signal CTL (with or without polarity inversion) and performing logic operations (for instance, Boolean logic) thereon.

Figure 6B:
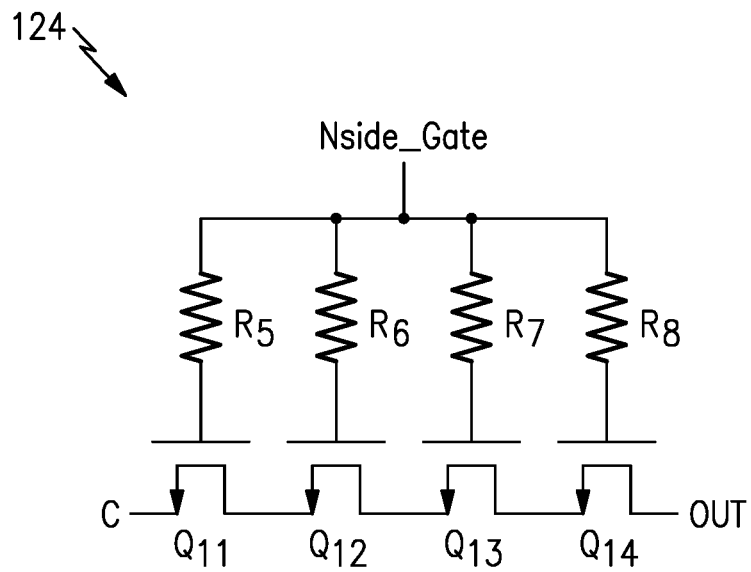
FIG. 6B illustrates a negative side switch stack of FIG. 6A according to one embodiment.
Figure 6C:
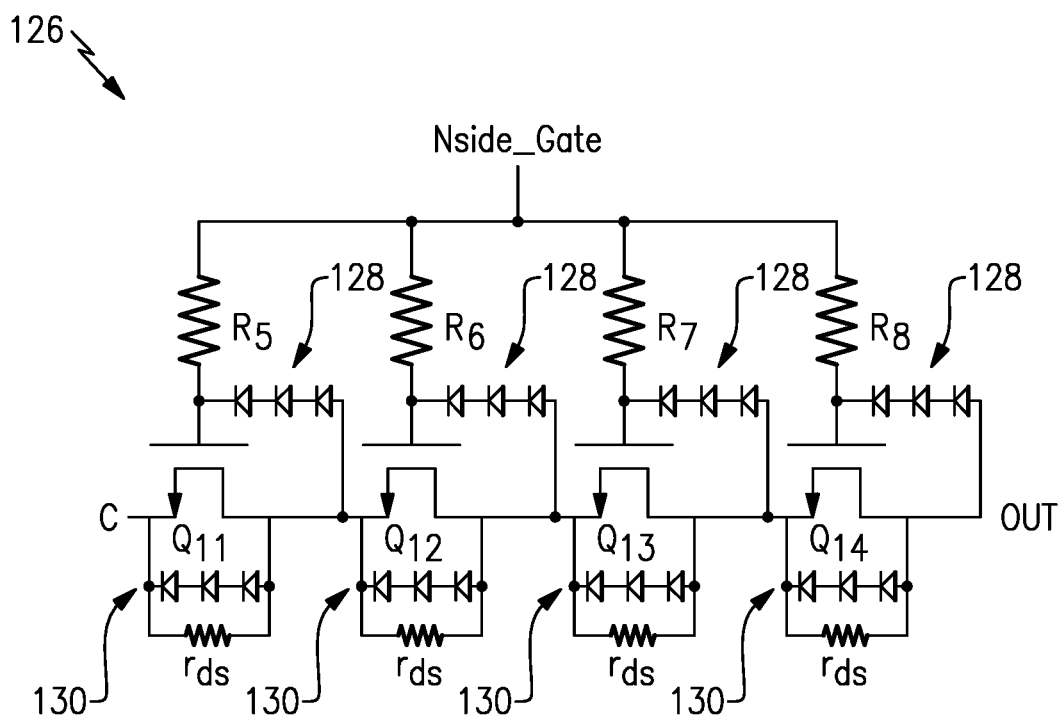
FIG. 6C illustrates a negative side switch stack according to another embodiment.

FIGS. 6B and 6C illustrate two embodiments of the negative side switch stack in accordance with aspects of this disclosure. In particular, FIG. 6B shows the same implementation from FIG. 6A while FIG. 6C illustrates another implementation for the negative side switch stack. Although embodiments of the negative side switch stack are illustrated in FIGS. 6B and 6C, skilled artisans will readily appreciate that the positive side switch stack may be implemented in a similar manner with minor modifications (e.g., using PFETs in place of the NFETs).

With reference to FIG. 6B, the negative side switch stack 124 is configured to receive a negative side switch stack control signal Nside_Gate. The negative side switch stack 124 includes a plurality of NFETs $Q_{11}$, $Q_{12}$, $Q_{13}$, and $Q_{14}$ ($Q_{11}$-$Q_{14}$), and a plurality of gate resistors $R_5$, $R_6$, $R_7$, and $R_8$ ($R_5$-$R_8$) respectively connected to the NFETs $Q_{11}$-$Q_{14}$. The NFETs $Q_{11}$-$Q_{14}$ are biased with the negative side switch stack control signal Nside_Gate (e.g., which may be 3.3V in certain embodiments) during the peaking event such that the NFETs $Q_{11}$-$Q_{14}$ form high voltage capable self-opening transistors during the peaking events.

With reference to FIG. 6C, the illustrated embodiment of the negative side switch stack 126 includes NFETs $Q_{11}$-$Q_{14}$ and gate resistors $R_5$-$R_8$, similar to the FIG. 6B embodiment, and further includes a first plurality of stacked diodes 128, a second plurality of stacked diodes 130, and a resistor $r_{ds}$ for each NFET $Q_{11}$-$Q_{14}$ (e.g., six diodes and one resistor may be included for each of the NFETs $Q_{11}$-$Q_{14}$).

The stacked diodes 128 are connected in series between a drain and a gate of each NFET, while the stacked diodes 130 are connected in series between the drain and a source of each NFET. Additionally, the resistor $r_{ds}$ is in parallel with the stacked diodes 130.

The stacked NFET $Q_{11}$-$Q_{14}$ are protected by the diodes 128, and the diodes 130, and the resistors $r_{ds}$. When the output node OUT voltage is boosted (e.g., double $V_{SS}$ for the negative side switch stack 124 or double $V_{DD}$ for the positive side switch stack 104), the NFETs $Q_{11}$-$Q_{14}$ are protected by the diodes 128 and 130 as well as the stacking of the NFETs $Q_{11}$-$Q_{14}$. Depending on the embodiment, the number NFETs $Q_{11}$-$Q_{14}$ can be increased or reduced, for example, depending on the amount of boost provided by the charge pump circuits and/or transistor reliability considerations. The resistors $r_{ds}$ may be implemented with a relatively large resistance in order to have a substantially equal drain-to-source voltage Vas when the NFETs $Q_{11}$-$Q_{14}$ are OFF.

The RF switch may also include one or more delay elements (not illustrated) and one or more logic gates (not illustrated) configured to asynchronously generate the precharge and discharge signals Precharge_p, Discharge_p, Precharge_n, and Discharge_n. The delay element(s) and/or logic gate(s) may also be configured to asynchronously generate the positive side switch stack control signal Pside_Gate and the negative side switch stack control signal Nside_Gate. Such delay elements and logic gates can be included in the logic circuit 123 of FIG. 6A.

Referring back to FIG. 6A, during a low to high transition, the positive side 100 is configured boost the output node OUT voltage to two times $V_{DD}$, while the stacking of the NFETs $Q_{11}$-$Q_{14}$ on the negative side 120 protects the NFETs $Q_{11}$-$Q_{14}$ from the large voltage differential between the node C and the output node OUT. The NFETs $Q_{11}$-$Q_{14}$ are biased with Nside_Gate (e.g., which may be 3.3V) such that the NFETs $Q_{11}$-$Q_{14}$ form high voltage capable self-opening during the peaking events.

During high to low transitions, the negative side 120 is configured boost the output node OUT voltage to two times $V_{SS}$, while the stacking of the PFETs $Q_4$-$Q_7$ on the positive side 100 protects the PFETs $Q_4$-$Q_7$ from the large voltage differential between the node C and the output node OUT. The PFETs $Q_4$-$Q_7$ are biased with Pside_Gate (e.g., which may be −3.3V in this operating scenario) such that the PFETs $Q_4$-$Q_7$ form high voltage capable self-opening during the peaking events.

Figure 7:
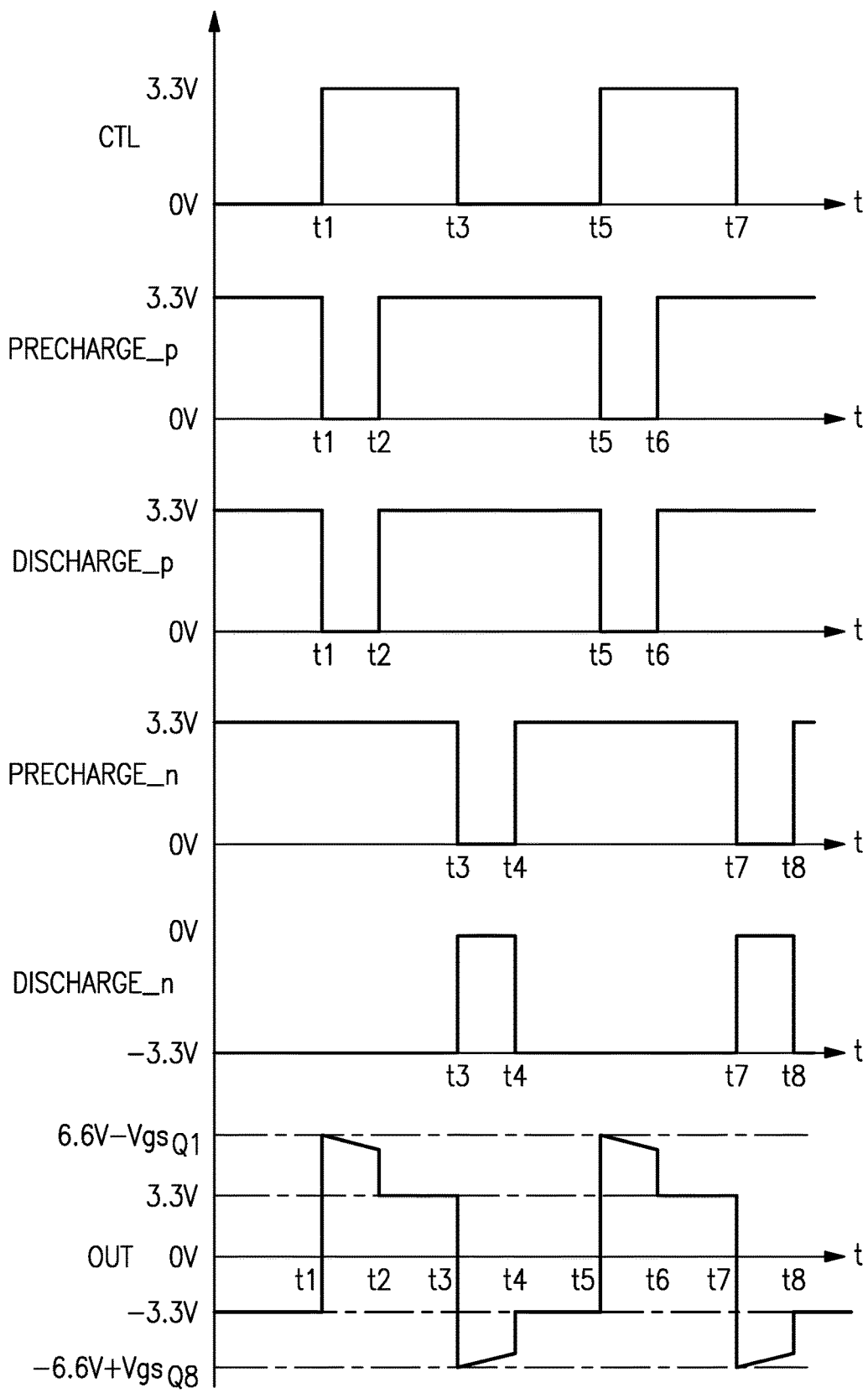
FIG. 7 illustrates the timing of the control signals and output node for the fast switching circuit of FIG. 6A.

FIG. 7 illustrates the timing of the control signals and output node for the fast switching circuit 92 of FIG. 6A. With reference to FIGS. 6A and 7, between times 0 to t1, the RF switch 92 is in a low state. In this low state, the control signals Precharge_p and Precharge_n turn the switches $Q_3$ and $Q_{10}$ ON. The node A is close to 3.3V (e.g., node A may have a voltage of about 3.3V-$V_{gs}Q_1$) and node B may have a ground GND voltage (or another third supply voltage between the power high and power low supply voltages). The first capacitor 102 between noes A and B is charged to about 3.3V in this state. The node C is close to −3.3V (e.g., node C may have a voltage of about −3.3V+$V_{gs}Q_8$) and node D may have a GND voltage. The second capacitor 122 between nodes C and D is changed to about −3.3V in this state.

The control signal Pside_Gate may be held at 3.3V, so PFETs $Q_4$-$Q_7$ are OFF. The node OUT is not set by the positive side 100 during this period. The control signal Nside_Gate may be held at −3.3V, so NFETs $Q_{11}$-$Q_{14}$ are OFF. The node OUT is also not set by the negative side 120 during this period. Thus, the node OUT is not set by the fast switching circuit 92, but rather by the digital buffer 80 (see FIG. 4).

Between times t1 to t2, the RF switch 92 receives a low to high transition signal at t1, and the control signal Precharge_p sets the switch $Q_3$ to OFF and the control signal Discharge_p sets the switch $Q_2$ to ON. In response to the changes to the states of switches $Q_2$ and $Q_3$, the node B becomes about 3.3V (e.g., goes from 0V to 3.3V) and due to charge conservation node A becomes 6.6V-$V_{gs}Q_1$. Since the control signal Pside_Gate is always 3.3V in this example, the PFETs $Q_4$-$Q_7$ are turned ON due to the voltage at node A.

Accordingly, the node OUT is set by the positive side 100 and initially the node OUT voltage becomes 6.6V-$V_{gs}Q_1$. During this time interval, since the node OUT voltage is 6.6V-$V_{gs}Q_1$ and node C is −3.3V during this interval, the four stacked NFETs $Q_{11}$-$Q_{14}$ protect the components on the negative side 120 from breakdown. Also, since the gates of NFETs $Q_{11}$-$Q_{14}$ are at −3.3V, the bootstrapping resistors $R_5$-$R_9$ protect the NFETs $Q_{11}$-$Q_{14}$.

In the t1 to t2 interval, the node OUT voltage initially becomes 6.6V-$V_{gs}Q_1$ and the charge on the first capacitor 102 is shared by the node OUT capacitor and the driven gate capacitors of the RF transistors (e.g., transistors 21a−21d of FIG. 4). Thus, the voltage on node A and node OUT decay as shown in FIG. 7.

The boosting phase ends at time t2, and thus between times t2 and t3, both switches $Q_2$ and $Q_3$ are OFF. Node A returns to 3.3V and PFETs $Q_4$-$Q_7$ are turned OFF. During this interval, node OUT is set by the digital buffer 80.

In the interval at t3 to t4, the RF switch 92 receives a high to low transition signal at t3, and the control signal Precharge_n sets the switch $Q_{10}$ to OFF and the control signal Discharge_p sets the switch $Q_9$ to ON. Node D thus becomes −3.3V (e.g., from 0V to −3.3V) and due to charge conservation node C becomes −6.6+$V_{gs}Q_8$. Since the control Nside_Gate is always −3.3V in this example, NFETs $Q_{11}$-$Q_{14}$ are turned ON.

Accordingly, the node OUT is set by the negative side 120 and initially node OUT becomes −6.6V+$V_{gs}Q_8$. During this time interval, since node OUT is −6.6V+$V_{gs}Q_8$ and node A is +3.3V, the four stacked PFETs $Q_4$-$Q_7$ protect the components on the positive side 100 from breakdown. Also, since the gates of PFETs $Q_4$-$Q_7$ are at +3.3V, the bootstrapping resistors $R_1$-$R_4$ protect PFETs $Q_4$-$Q_7$.

In the t3 to t4 interval, initially node OUT becomes −6.6V+$V_{gs}Q_8$ and the charge on the second capacitor 122 is shared by the node OUT capacitor and the driven RF transistor gate capacitor. Thus, the voltage on node A and node OUT decay.

After t4, the boosting phase is over and both switches $Q_9$ and $Q_{10}$ are turned OFF. Node C returns to −3.3V and NFETs $Q_{11}$-$Q_{14}$ are turned OFF. During the interval between t4 and t5, the node OUT is set by the digital buffer 80.

Figure 8A:
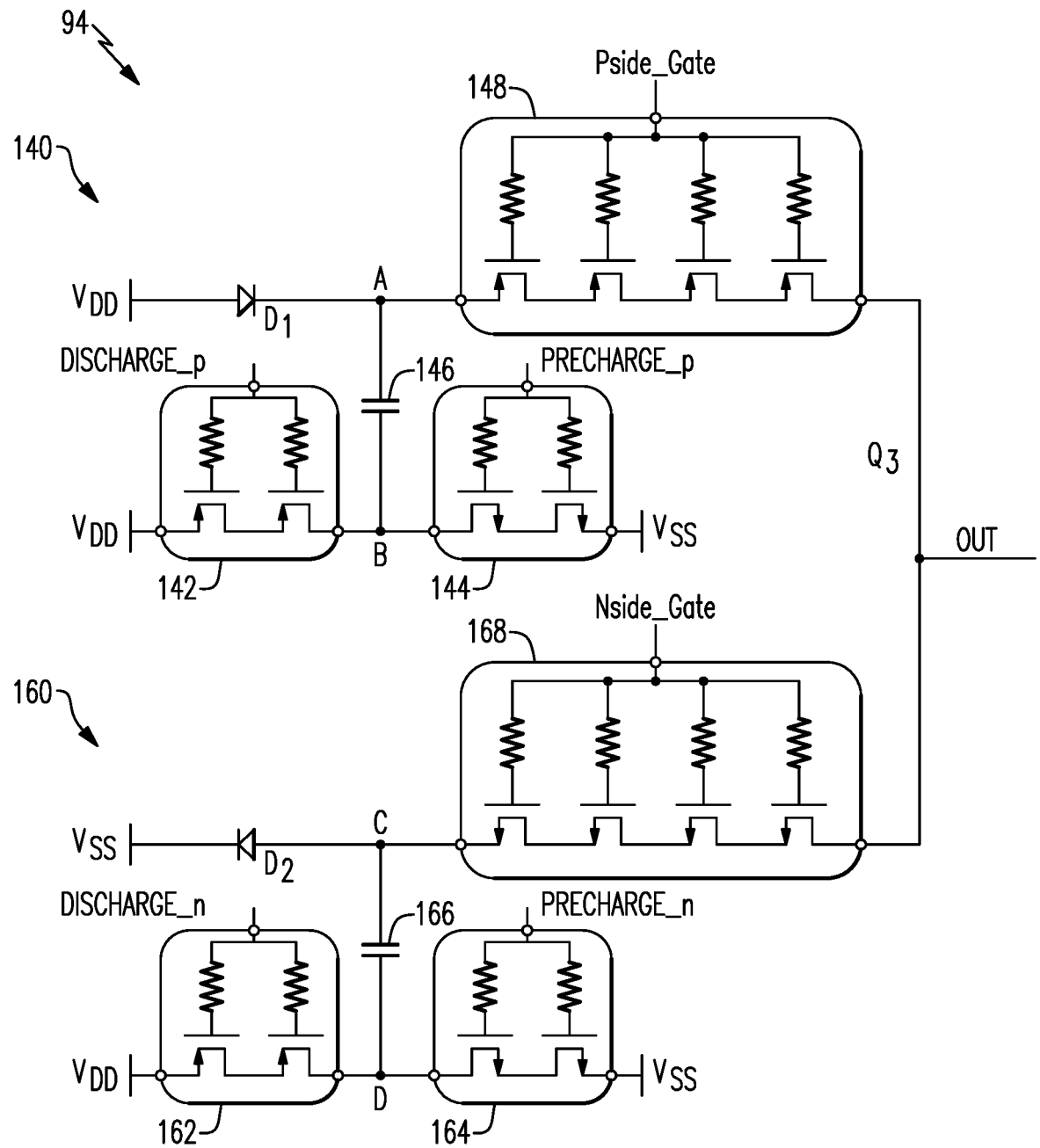
FIG. 8A is a circuit diagram of a fast switching circuit according to another embodiment.

FIG. 8A is a circuit diagram of a fast switching circuit 94 according to another embodiment. The fast switching circuit 94 includes several components similar to those of the fast switching circuit 92 described in connection with FIG. 6A, and thus, a discussion of these similar components may be omitted in the following discussion of FIG. 8A.

The fast switching circuit 94 includes a positive side 140 configured to boost the output node OUT voltage when the output node OUT voltage is positive and a negative side 160 configured to boost the output node OUT voltage when the output node OUT voltage is negative. The positive side 140 includes a first diode D1, two pairs of stacked transistors 142 and 144, a first capacitor 146, and a positive side switch stack 148. Similarly, the negative side 160 includes a second diode D2, two pairs of stacked transistors 162 and 164, a second capacitor 166, and a negative side switch stack 168. The positive side switch stack 148 and the negative side switch stack 168 may be implemented in accordance with any one of FIGS. 6A-6C or using any other suitable arrangement.

Each of the pairs of stacked transistors 142, 144, 162, and 164 may be implemented with two transistors (e.g., either PFET or NFET as illustrated in FIG. 8A) and a pair of bootstrapping resistors respectively coupled to the gates of the transistors. Each of the pairs of stacked transistors 142, 144, 162, and 164 is configured to receive a corresponding control signal Discharge_p, Precharge_p, Discharge_n, and Precharge_n. Although an example with two transistors and corresponding components is shown, additional transistors can be included to allow handling of larger voltage differences with reliability (for example, without exceeding maximum-rated transistor junction voltage specifications).

The fast switching circuit 94 is configured to boost the output node OUT voltage to about three times each of the power high supply voltage $V_{DD}$ and the power low supply voltage $V_{SS}$. In particular, the first and second capacitors 146 and 166 are each configured to be toggled between the power high supply voltage $V_{DD}$ and the power low supply voltage $V_{SS}$ (e.g., rather than between ground and one of the supply voltages $V_{DD}$ and $V_{SS}$ as in FIG. 6A). When the power high supply voltage $V_{DD}$ is not equal in magnitude to the power low supply voltage $V_{SS}$, the amount of boost may be less than or greater than three times each of the power high supply voltage $V_{DD}$ and the power low supply voltage $V_{SS}$. Toggling the first and second capacitors 146 and 166 between these values allows for higher voltage peaking, enabling the nearly tripling of the supply voltages $V_{DD}$ and $V_{SS}$. However, in order to enable this higher voltage peaking the stack switch structures include stacked transistor pairs 142, 144, 162, and 164 so that each transistor maintains its on/off condition without exceeding safe operating voltages.

In some implementations, there may be some inefficiencies in the charge pump circuits such that the boosted signals are not fully three time the power high/low supply voltages $V_{DD}$ and $V_{SS}$. Depending on the implementation the first and second charge pump circuits may be configured to boost the respective power high/low supply voltages $V_{DD}$ and $V_{SS}$ to greater than 2.5 times, greater than 2.8 times, and/or greater than 2.9 times the power high/low supply voltages $V_{DD}$ and $V_{SS}$.

The positive side switch stack 148 transistors are biased with the control signal Pside_Gate (e.g., $V_{DD}$) so that they form high voltage capable self-opening switches during the peaking events. The negative side switch stack 168 transistors are biased with the control signal Nside_Gate (e.g., $V_{SS}$) so that they form high voltage capable self-opening switches during the peaking events.

Figure 8B:
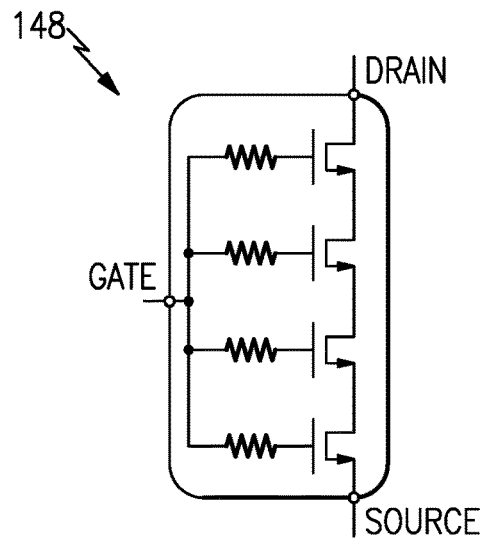
FIG. 8B illustrates a negative side switch stack of FIG. 8A according to one embodiment.
Figure 8C:
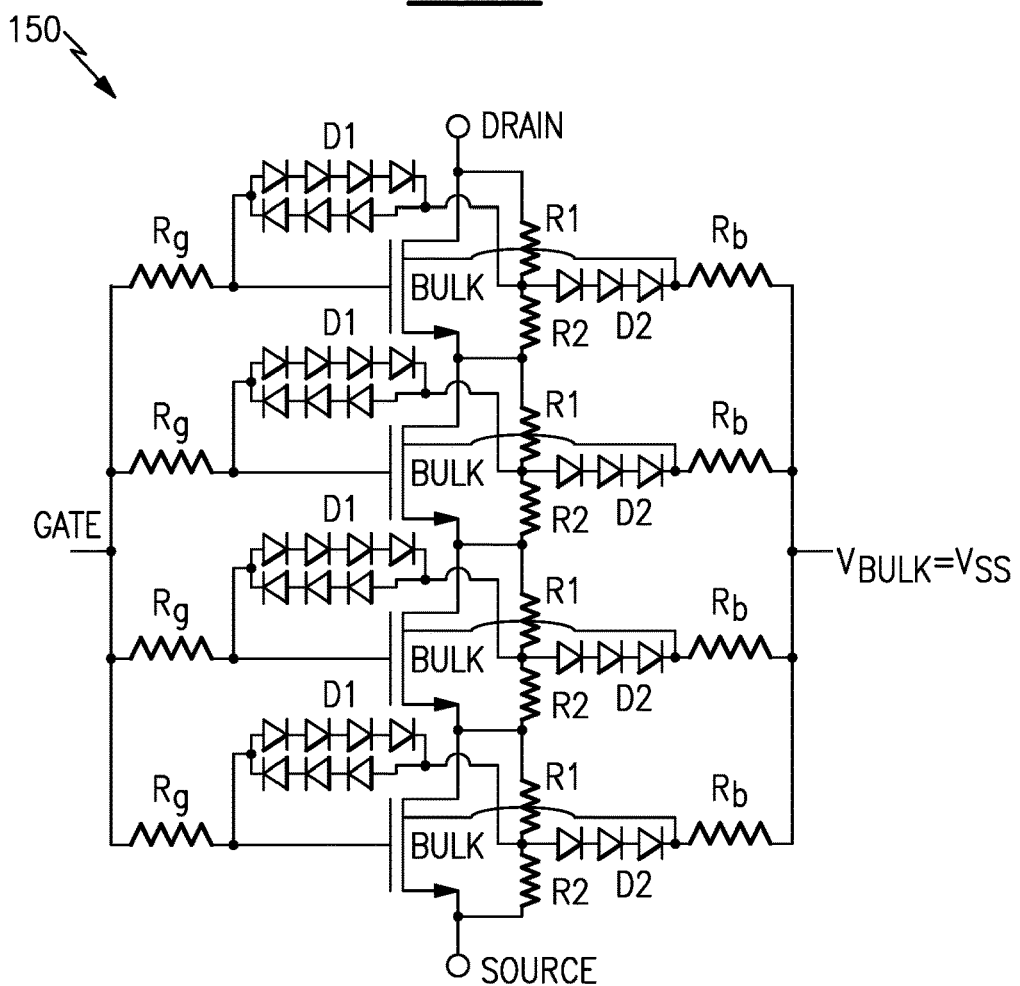
FIG. 8C illustrates a negative side switch stack according to another embodiment.

FIGS. 8B and 8C illustrate two embodiments of the negative side switch stack 168 in accordance with aspects of this disclosure. In particular, FIG. 8B shows the same implementation from FIG. 8A while FIG. 8C illustrates another implementation for the negative side switch stack. The switch structure of FIG. 8C can also be used in other applications in need of a DC switch with high-voltage capability. Although embodiments of the negative side switch stack are illustrated in FIGS. 8B and 8C, the positive side switch stack may be implemented in a similar manner with minor modifications (e.g., using PFETs in place of the NFETs).

The embodiment of FIG. 8C provides a high-voltage capable DC switch that can be used to provide high DC voltage handling using a diode based bias structure. In particular, a diode loop (for example, a pair of anti-parallel diode chains D2) may be formed on the gate side of each of the NFETs, and a diode network D3 and a resistor $R_b$ may be formed on the body side of the NFETs. In this example, the drain-to-source resistor of each NFET is portioned into two resistors $R_1$ and $R_2$ connected at an intermediate node, and the pair of anti-parallel diodes chains is connected between the gate of the NFET and the intermediate node. Additionally, the diode network connects D3 between the intermediate node and the bulk (body) of the NFET, while the resistor $R_b$ connects between the body of the NFET and a bulk voltage $V_{BULK}$ (which can be equal to $V_{SS}$).

In addition, three gate resistors $R_{gDC}$, $R_{g1}$, and $R_{g2}$ are arranged in series between the gate voltage Gate and the gates of each of the NFETs. A capacitor $C_1$ is arranged in parallel with the gate resistor $R_{gDC}$ and a diode $D_1$ is arranged in parallel with the gate resistor $R_{g2}$. The diode $D_1$ is configured to bypass the gate resistor $R_{g2}$ during negative peaking voltage which reduces self-turn on time of the NFETs. However, the diode $D_1$ does not turn on during positive peaking events occurring at the drain terminals of the NFETs. This presents a relatively large gate resistance (e.g., the combined value of the gate resistors $R_{gDC}$, $R_{g1}$, and $R_{g2}$) during the off-state of the NFETs. Accordingly, the stack switch structure maintains a high off-resistance.

In addition, the DC portion of the gate resistance can be increased adding the gate resistor $R_{gDC}$ and the capacitor $C_1$. The gate resistor $R_{gDC}$ and the capacitor $C_1$ provide a relatively low impedance during the switching transitions and provide a relatively high impedance during DC steady state, thereby reducing DC leakage. Accordingly, the gate resistor R g pc and the capacitor $C_1$ have substantially no effect during transitions but reduce DC leakage during steady state.

Figure 9:
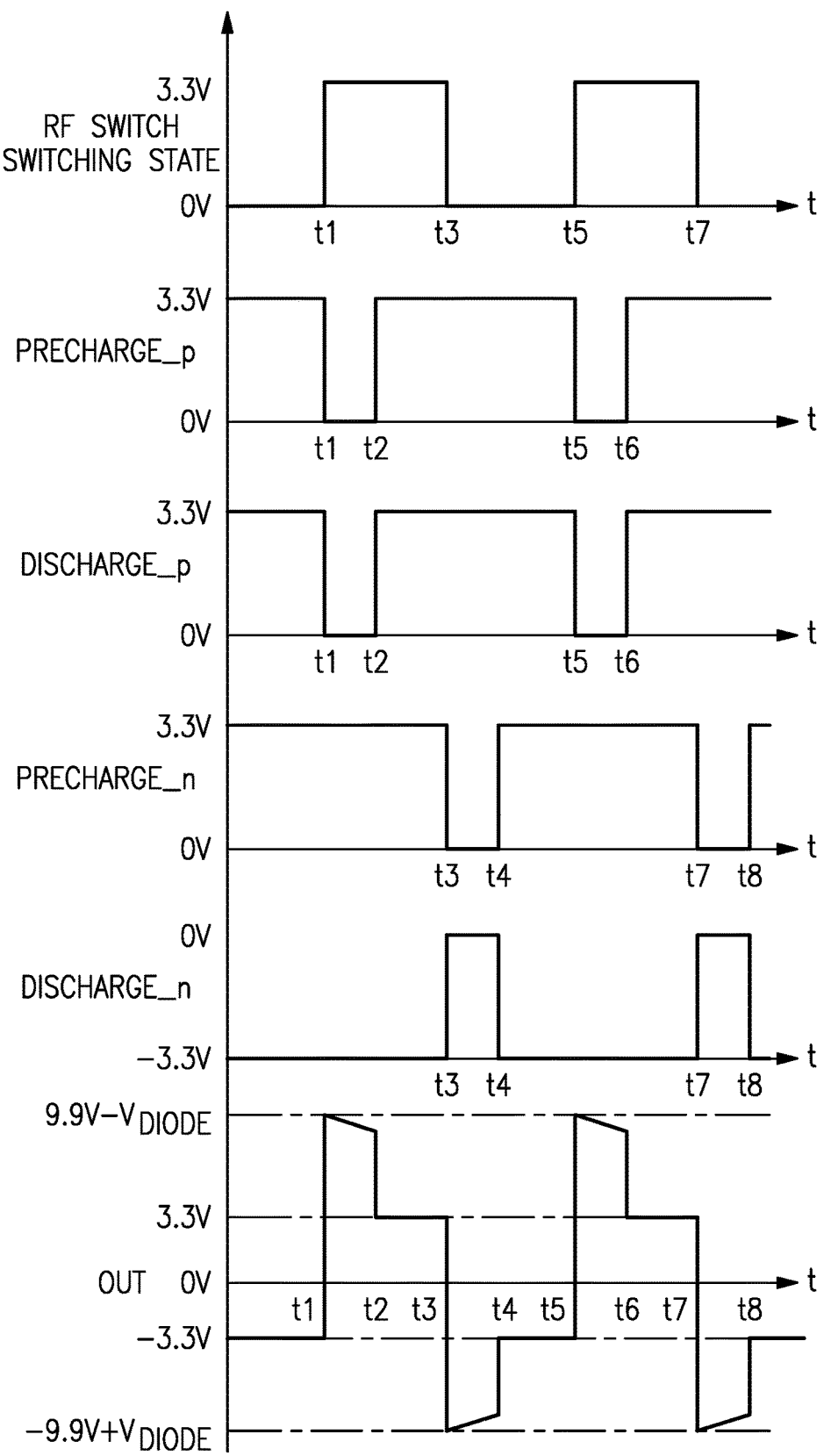
FIG. 9 illustrates the timing of the control signals and output node for the fast switching circuit of FIG. 8A.

FIG. 9 illustrates the timing of the control signals and output node for the fast switching circuit 94 of FIG. 8A. The timing diagram is substantially the same as the diagram of FIG. 7, with the difference being the value of the boosted voltage at the output node OUT.

Figure 10:
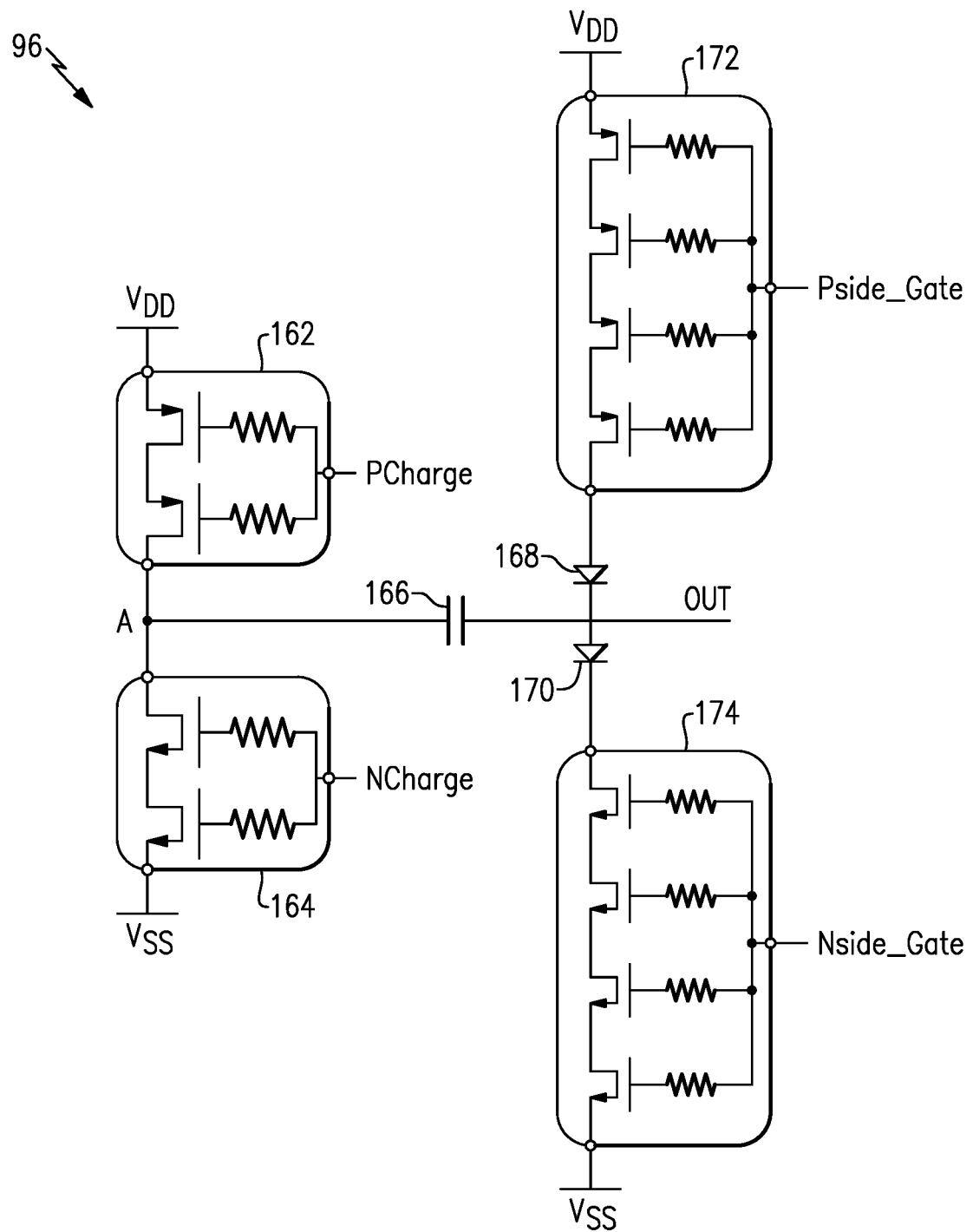
FIG. 10 is a circuit diagram of a fast switching circuit according to yet another embodiment.

FIG. 10 is a circuit diagram of a fast switching circuit 96 according to yet another embodiment. The fast switching circuit 96 is simplified in certain aspects compared to the embodiment of FIG. 6A without including separate positive and negative sides. The fast switching circuit 96 includes a positive pair of stacked transistors 162, a negative pair of stacked transistors 164, a capacitor 166, first and second diodes 168 and 170, a positive switch stack 172, and a negative switch stack 174.

The fast switching circuit 96 of FIG. 10 is configured to boost the node OUT voltage to about three times each of $V_{DD}$ and $V_{SS}$. One advantage to the configuration illustrated in FIG. 10 is the use of only a single capacitor 166 and lower number of transistors compared to other implementations. Thus, the layout area of this implementation can be 50% smaller compared to other topologies. The trade-off may be a smaller improvement to the switching speed compared to other embodiments, due to the exponential decaying behavior of the node OUT.

Figure 11:
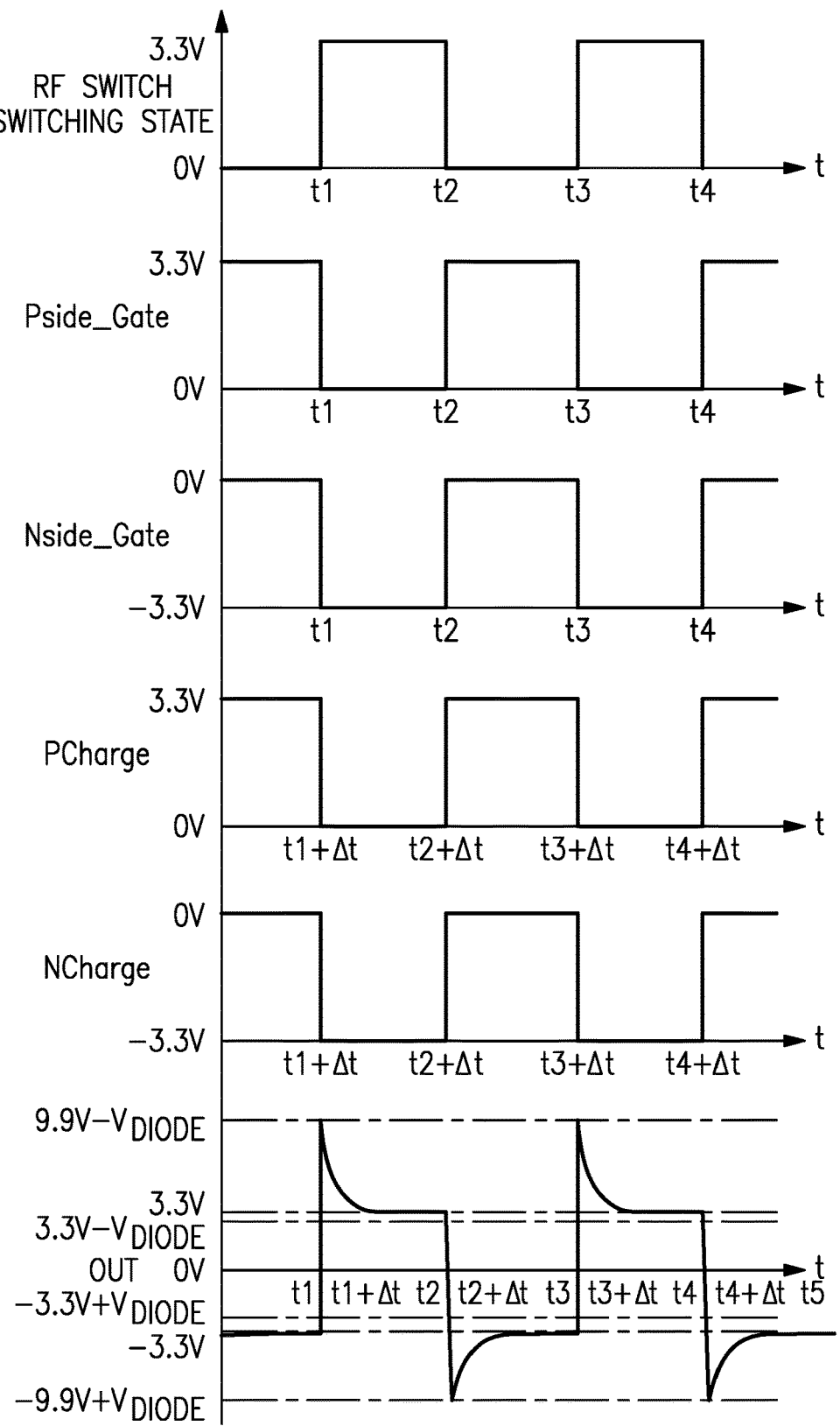
FIG. 11 illustrates the timing of the control signals and output node for the fast switching circuit of FIG. 10.

FIG. 11 illustrates the timing of the control signals and output node for the fast switching circuit 96 of FIG. 10. With reference to FIGS. 10 and 11, in the interval between times 0 and t1, node A and node OUT are −3.3V. The control signal Nside_Gate is configured to turn on the transistors in the negative switch stack 174 and the control signal Pside_Gate is configured to turn off the transistors in the positive switch stack 172. The negative pair of stacked transistors 164 is turned on via the control signal Ncharge transistors are ON and the positive pair of stacked transistors 162 are turned off by the control signal Pcharge.

In the interval between t1 and t1+Δt, (in some implementations, Δt is as small as couple of ns), the control signal Pside_Gate is configured to turn on the transistors in the positive switch stack 172 and the control signal Nside_Gate is configured to turn off the transistors in the negative switch stack 174. Accordingly, the node OUT voltage becomes 3.3V-$V_{Diode}$ Node A has the same voltage as the previous interval at −3.3V. During this interval, the capacitor 166 is charged to 6.6V.

In the interval between t1+Δt and t2, the control signal Pcharge is set to turn on the positive pair of stacked transistors 162 and the control signal Ncharge is set to turn off the negative pair of stacked transistors 164, such that node A jumps to a voltage of 3.3V. This in turn jumps the node OUT to a voltage of 9.9V-$V_{Diode}$ After this jump at node OUT, the node OUT voltage decrease to 3.3V without the need of any extra timing since node OUT charges the RF switch by using the capacitor 166 charge. Due to the charging using the capacitor 166, the node OUT voltage decays exponentially from 9.9V-$V_{Diode}$ to 3.3V. The value of the capacitor 166 can be selected similar to the RF Switch gate capacitor. The negative jump/boost of the voltage from t2 to t3 is similar to the positive jump.

Figure 12:
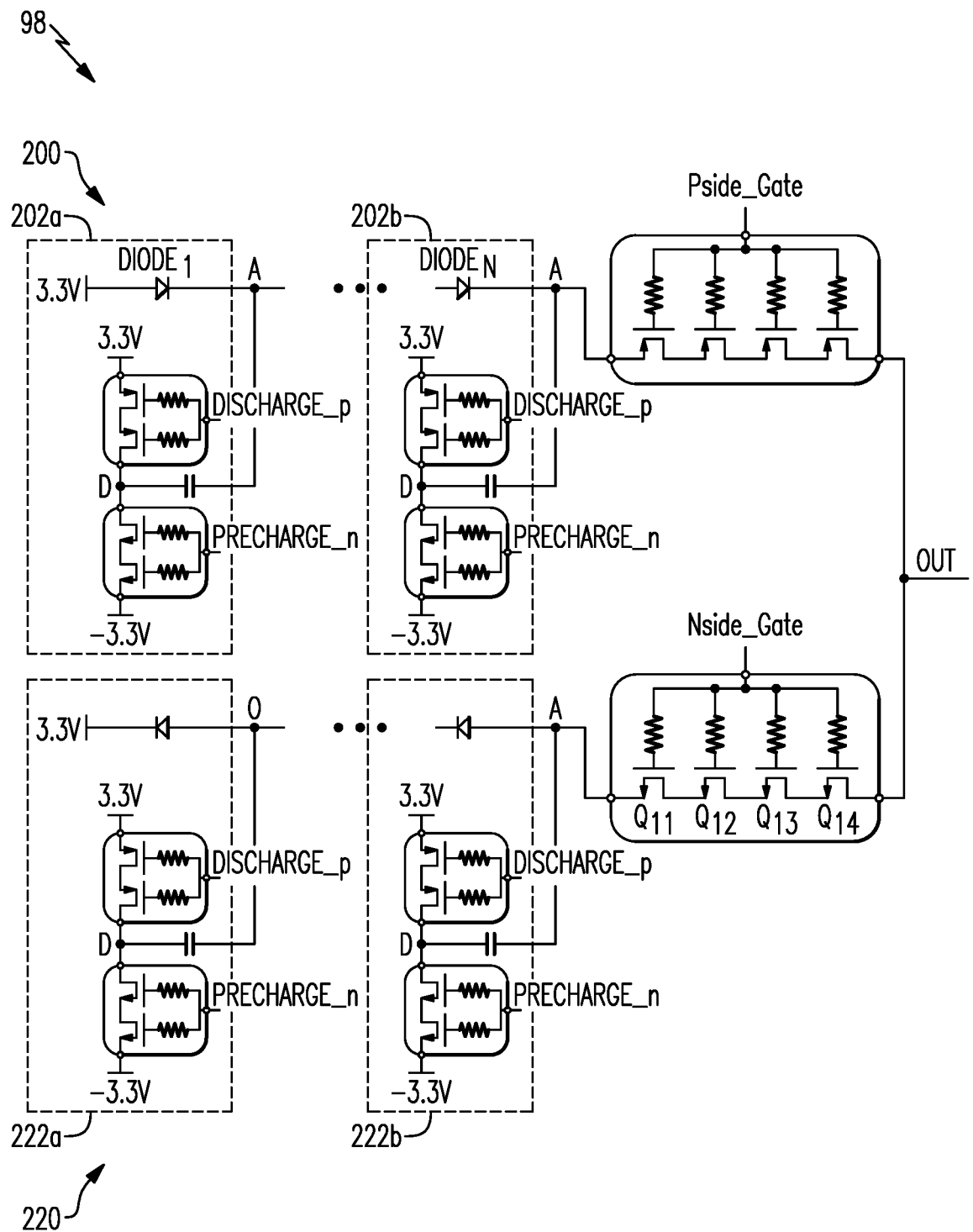
FIG. 12 is a circuit diagram of a fast switching circuit according to still yet another embodiment.

FIG. 12 is a circuit diagram of a fast switching circuit 98 according to still yet another embodiment. The fast switching circuit 98 includes an architecture similar to that of FIG. 8A in which each of the positive and negative sides 200 and 220 in which a plurality of charge pump circuits 202a, 202n, 222a, 222n are cascaded. By cascading a plurality of charge pump circuits 202a, 202n, 222a, 222n, the supply voltages $V_{DD}$ and $V_{SS}$ can be boosted to higher than three times the supply voltage $V_{DD}$ and $V_{SS}$ values. Any number of charge pump circuits can be cascaded in accordance with the teachings herein.

The fast switching circuit 98 includes several components similar to those of the fast switching circuit 94 described in connection with FIG. 8A, and thus, a discussion of these similar components has been omitted.

Applications

Devices employing the above described schemes can be implemented into various electronic devices. Examples of electronic devices include, but are not limited to, RF communication systems, consumer electronic products, electronic test equipment, communication infrastructure, etc. For instance, RF switches with fast switching can be used in a wide range of RF communication systems, including, but not limited to, base stations, mobile devices (for instance, smartphones or handsets), laptop computers, tablets, Internet of Things (IoT) devices, and/or wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) switching circuit comprising:
a field-effect transistor (FET) switch including a gate;
a digital buffer configured to provide a first output voltage to the gate of the FET switch during a steady-state of the FET switch, the first output voltage comprising at least one supply voltage; and
a fast switching circuit configured to provide a second output voltage to the gate of the FET switch during a switching state of the FET switch, the fast switching circuit comprising at least one charge pump configured to generate at least one boosted supply voltage by boosting the at least one supply voltage, the fast switching circuit configured to generate the second output voltage based on the at least one boosted supply voltage, the steady-state of the FET switch following the switching state of the FET switch,
wherein the fast switching circuit is configured to generate the at least one boosted supply voltage without the use of an oscillator.

2. The RF switching circuit of claim 1, wherein the at least one supply voltage comprises a power high supply voltage and a power low supply voltage, the at least one charge pump comprises a first charge pump and a second charge pump, and the fast switching circuit comprises: a positive side including the first charge pump configured to receive the power high supply voltage and to boost the power high supply voltage to a voltage greater than 1.5 times the power high supply voltage, and a negative side including the second charge pump configured to receive the power low supply voltage and boost the power low supply voltage to a voltage greater than 1.5 times the power low supply voltage.

3. The RF switching circuit of claim 2, wherein the positive side further comprises a positive side switch stack coupling the first charge pump to an output node that provides the second output voltage, the positive side switch stack comprising a first plurality of transistor switches configured to self-open during a first switching state of the FET switch, and the negative side further comprises a negative side switch stack coupling the second charge pump to the output node, the negative side switch stack comprising a second plurality of transistor switches configured to self-open during a second switching state of the FET switch.

4. The RF switching circuit of claim 2, wherein the negative side further comprises a negative side switch stack coupling the second charge pump to an output node that provides the second output voltage, the negative side switch stack comprising a plurality of transistor switches in series and each having a gate coupled to a first gate resistor, a second gate resistor, and a third gate resistor arranged in series, wherein the first gate resistor is arranged parallel with a capacitor, and the third gate resistor is arranged in parallel with a diode.

5. The RF switching circuit of claim 1, wherein the at least one charge pump comprises a first charge pump including a first transistor coupled between a third supply voltage and a first node and configured to receive a precharge control signal, a second transistor coupled between the power high supply voltage and the first node and configured to receive a discharge control signal, and a capacitor coupled between the first node and a second node.

6. The RF switching circuit of claim 5, wherein the first charge pump further comprises a third transistor coupled between the second node and the power high supply voltage, the first and second transistors configured to supply the third supply voltage to the first node prior to a first switching state of the FET switch and supply the power high supply voltage to the first node after the first switching state, and wherein changing the first node from the third supply voltage to the power high supply voltage boosts the second node to two times the power high supply voltage.

7. The RF switching circuit of claim 1, wherein the at least one charge pump comprises a first charge pump including a first switch coupled between a power high supply voltage and a first node, a second switch coupled between a power low supply voltage and the first node, and a capacitor directly coupled between the first node and an output node that provides the second output voltage.

8. The RF switching circuit of claim 7, wherein the first switch is configured to receive a positive charge control signal and the second switch is configured to receive a negative charge control signal, the first and second switched configured to couple the first node to the power low supply voltage prior to a first switching state of the FET switch, couple the first node to the power high supply voltage after the first switching state, couple the first node to the power high supply voltage prior to a second switching state of the FET switch, and coupled the first node to the power low supply voltage after the second switching state.

9. The RF switching circuit of claim 1, wherein the fast switching circuit comprises a positive side including a first plurality of cascaded charge pumps and a negative side including a second plurality of cascaded charge pumps.

10. A radio frequency (RF) switching circuit comprising:
a field-effect transistor (FET) switch including a gate;
a digital buffer configured to provide a first output voltage to the gate of the FET switch during a steady-state of the FET switch, the first output voltage comprising at least one supply voltage; and
a fast switching circuit configured to provide a second output voltage to the gate of the FET switch during a switching state of the FET switch, the fast switching circuit comprising at least one charge pump configured to generate at least one boosted supply voltage by boosting the at least one supply voltage, the fast switching circuit configured to generate the second output voltage based on the at least one boosted supply voltvoltage, the steady-state of the FET switch following the switching state of the FET switch,
wherein the at least one charge pump comprises a first charge pump including a first switch coupled between a power low supply voltage and a first node and configured to receive a precharge control signal, a second switch coupled between a power high supply voltage and the first node and configured to receive a discharge control signal, and a capacitor coupled between the first node and a second node.

11. The RF switching circuit of claim 10, wherein the charge pump further comprises a diode coupled between the second node and the power high supply voltage, the first and second switches configured to supply the power low supply voltage to the first node prior to a first switching state of the FET switch and supply the power high supply voltage to the first node after the first switching state, and wherein changing the first node from the power low supply voltage to the power high supply voltage boosts the second node to a voltage greater than 2.5 times the power high supply voltage.

12. The RF switching circuit of claim 10, wherein each of the first and second switches comprises a pair of stacked transistors.

13. A fast switching circuit for driving a transistor gate of a transistor switch, the circuit comprising:
a first charge pump configured to receive a power high supply voltage and to generate a boosted power high supply voltage greater than the power high supply voltage;
a first switch stack coupled between the first charge pump and an output node that controls the transistor gate;
a second charge pump configured to receive a power low supply voltage and to generate a boosted power low supply voltage less than the power low supply voltage; and
a second switch stack coupled between the second charge pump and the output node,
wherein the first charge pump and the second charge pump are configured to output one of the boosted power high supply voltage or the boosted power low supply voltage during a switching state of the transistor switch, and
wherein the first charge pump comprises a first transistor coupled between a third supply voltage and a first node and configured to receive a positive precharge control signal, a second transistor coupled between the power high supply voltage and the first node and configured to receive a positive discharge control signal, and a first capacitor coupled between the first node and a second node.

14. The fast switching circuit of claim 13, wherein the first charge pump further comprises a third transistor coupled between the second node and the power high supply voltage, the first and second transistors configured to supply the third supply voltage to the first node prior to a first switching state of the transistor switch and supply the power high supply voltage to the first node after the first switching state, and wherein changing the first node from the third supply voltage to the power high supply voltage boosts the second node to two times the power high supply voltage.

15. The fast switching circuit of claim 13, wherein the second charge pump comprises a fourth transistor coupled between the third supply voltage and a third node and configured to receive a negative precharge control signal, a fifth transistor coupled between the power low supply voltage and the third node and configured to receive a negative discharge control signal, and a second capacitor coupled between the third node and a fourth node.

16. The fast switching circuit of claim 15, wherein the second charge pump further comprises a sixth transistor coupled between the fourth node and the power low supply voltage, the third and fourth transistors configured to supply the third supply voltage to the third node prior to a second switching state of the transistor switch from high to low and supply the power low supply voltage to the third node after the second switching state, and wherein changing the third node from the third supply voltage to the power low supply voltage boosts the fourth node to two times the power low supply voltage.

17. The fast switching circuit of claim 13, wherein the first charge pump comprises a first plurality of cascaded charge pumps and the second charge pump comprises a second plurality of cascaded charge pumps.

18. The fast switching circuit of claim 13, wherein the first and second charge pumps share a single capacitor directly coupled between the first and second charge pumps and the output node.

* * * * *